(12) United States Patent
Sah et al.

(10) Patent No.: US 6,275,059 B1
(45) Date of Patent: Aug. 14, 2001

(54) METHOD FOR TESTING AND DIAGNOSING MOS TRANSISTORS

(75) Inventors: Chih-Tang Sah; Arnost Neugroschel, both of Gainesville, FL (US)

(73) Assignee: University of Florida, Gainesville, FL (US)

(*) Notice: Subject to any disclaimer, the term of this patent is extended or adjusted under 35 U.S.C. 154(b) by 0 days.

(21) Appl. No.: 09/402,419

(22) PCT Filed: Apr. 4, 1998

(86) PCT No.: PCT/US98/06703

§ 371 Date: Oct. 4, 1999

§ 102(e) Date: Oct. 4, 1999

(87) PCT Pub. No.: WO98/45719

PCT Pub. Date: Oct. 15, 1998

Related U.S. Application Data

(60) Provisional application No. 60/043,370, filed on Apr. 4, 1997.

(51) Int. Cl.[7] ............................. G01R 31/28; G01R 31/26
(52) U.S. Cl. ............................................. 324/765; 324/769
(58) Field of Search ..................................... 324/765, 763, 324/768, 769, 158.1; 257/48; 702/185; 714/1, 40, 47, 41

(56) References Cited

U.S. PATENT DOCUMENTS

| | | | |
|---|---|---|---|
| 4,520,448 | 5/1985 | Tremintin | 324/768 |
| 5,286,656 | 2/1994 | Keown et al. | 257/48 |
| 5,404,109 | 4/1995 | Pribble et al. | 324/768 |

(List continued on next page.)

OTHER PUBLICATIONS

C. Sah, A. Neugroschel, K. Han, and J. Kavalieros, "Profiling Interface Traps in MOS Transistors by the DC Current–Voltage Method", *IEEE Electron Device Letters*, vol. 17, No. 2, pp. 72–74, Feb. 1996.

A. Neugroschel, C. Sah, J.M. Ford, J. Steele, R. Tang, C. Stein, "Comparison of Time–to–Failure of GeSi and Si Bipolar Transistors", *IEEE Electron Device Letters*, vol. 17, No. 5, pp. 211–213, May 1996.

J. T. Kavalieros and C. Sah, "Separation of Interface and Nonuniform Oxide Traps by the DC Current–Voltage Method", *IEEE Transactions on Electronic Devices*, vol. 43, No. 1, pp. 137–141, Jan. 1996.

A. Neugroschel, C. Sah, and M. Carroll, "Current–Acceleration for Rapid Time–to–Failure Determination of Bipolar Junction Transistors Under Emitter–Base Reverse–Bias Stress", *IEEE Transactions on Electronic Devices*, vol. 42, No. 7, pp. 1380–1383, Jul. 1995.

A. Neugroschel, C. Sah, and M. Carroll, "Accelerated Reverse Emitter–Base Bias Stress Methodologies and Time– –to–Failure Application," *IEEE Electron Device Letters*, vol. 17, No. 3, pp. 112–114, Mar. 1996.

A. Neugroschel, C. Sah, and M. Carroll, "Degradation of Bipolar Transistor Current Gain by Hot Holes During Reverse Emitter–Base Bias Stress", *IEEE Transactions on Electronic Devices*, vol. 43, No. 8, pp. 1286–1290, Aug. 1996.

*Primary Examiner*—Ernest Karlsen
(74) *Attorney, Agent, or Firm*—Akerman, Senterfitt & Eidson, P.A.

(57) ABSTRACT

A direct-current current-voltage (DCIV) method enables rapid evaluation of the degradation of deep-submicron nMOSTs and pMOSTs under channel hot carrier stress resulting from a p/n junction forward biased at a safe operating voltage level.

44 Claims, 28 Drawing Sheets

U.S. PATENT DOCUMENTS

| | | | |
|---|---|---|---|
| 5,493,231 | 2/1996 | Nicoolian et al. | 324/765 |
| 5,426,375 | 6/1995 | Roy et al. | 324/769 |
| 5,442,302 | 8/1995 | Fujimaki | 324/765 |
| 5,486,772 | 1/1996 | Hshieh et al. | 324/765 |
| 5,493,238 | 2/1996 | Takeuchi | 324/769 |
| 5,500,588 | 3/1996 | Worley | 324/765 |
| 5,504,431 | 4/1996 | Maeda et al. | 324/769 |
| 5,508,632 | 4/1996 | Shimizu et al. | 324/765 |
| 5,519,333 | 5/1996 | Righter | 324/765 |
| 5,519,336 | 5/1996 | Liu et al. | 324/765 |
| 5,550,484 | 8/1996 | Mitsumori et al. | 324/769 |
| 5,554,941 | 9/1996 | Kesel | 324/765 |
| 5,561,387 | 10/1996 | Lee | 324/765 |
| 5,598,009 * | 1/1997 | Bui | 324/765 |
| 5,625,288 * | 4/1997 | Snyder et al. | 324/763 |
| 5,726,458 * | 3/1998 | Bui | 257/48 |

* cited by examiner

METHOD FOR TESTING AND DIAGNOSING MOS TRANSISTORS

This application is a 371 of PCT/US98/06703 filed Apr. 4, 1998 which claims benefit of 60/043,370 filed Apr. 4, 1997.

BACKGROUND OF THE INVENTION

1. Field of the Invention

The invention relates to the field of testing and diagnosing MOS transistors and MOS transistor fabrication and design.

2. Description of the Related Art

A direct-current current-voltage (DCIV) measurement technique of interface and oxide traps on oxidized silicon is demonstrated. The technique uses the gate-controlled parasitic bipolar junction transistor of a metal-oxide-silicon field-effect transistor in a p/n junction isolation well to monitor the change of the oxide and interface trap density. The debase and collector currents are the monitors, hence, this technique is more sensitive and reliable than the traditional ac methods for determination of fundamental kinetic rates and transistor degradation mechanisms, such as charge pumping.

It is well recognized that the electrical characteristics of metal-oxide-semiconductor transistors (MOST's) and bipolar junction transistors (BJT's) degrade during circuit operation due to channel-hot-electron (CHE) and substrate-hot-electron (SHE) stresses which increase oxide ($Q_{OT}$) and interface trap ($Q_{IT}$) densities [1], [2][1]. In MOST's, the trapped charges reduce the mobility ($\Delta\mu$) and shift the threshold gate voltage ($\Delta V_{GT}$), both of which reduce drain saturation current ($\Delta I_D$) which slows down the switching speed due to longer charging time of interconnect or load capacitances at lower currents. The trapped charges also shift the subthreshold gate voltage ($\Delta V_{GT\text{-}sub}$), and decrease subthreshold slope of the drain-current versus gate-voltage curve, which reduces the current cut-off sharpness, thereby increasing leakage current or standby power and decreasing the noise margin. In BJT's, $Q_{IT}$ and $Q_{OT}$ will increase the minority carrier recombination rate in the base, thereby reducing its current gain, such as the common-emitter current gain, $\beta_F$ [3]. Thus, a quantative separation of the effects of $Q_{OT}$ and $Q_{IT}$ is necessary to delineate the location and physical origin of the degradation in order to design and manufacture highly reliable integrated circuits with ten-year or longer operating life.

The separation of $Q_{OT}$ and $Q_{IT}$ is generally difficult. It has not been reliably separated using the traditional capacitance and conductance methods or the transient methods because the test structures are two-terminal capacitors, or very small test transistors which give extremely small capacitances due to the very small device area. Many traditional methods for separating $Q_{OT}$ and $Q_{IT}$ were reviewed [4], and a two-step method was demonstrated. However, it uses the subthreshold slope to monitor $Q_{IT}$ which is reliable only when there is not an inhomogeneous or lateral distribution of $Q_{IT}$ and $Q_{OT}$. Hence, it is not reliable for monitoring the highly nonuniform $Q_{IT}$ and $Q_{OT}$ generated by CHE stress.

A novel method is demonstrated in this paper which measures the de base and collector currents versus the gate voltage, to be known as DCIV method (in analogy to the traditional usage such as HFCV for high-frequency capacitance-voltage or QSCV for quasi-static CV), to monitor the $Q_{IT}$ and $Q_{OT}$. The novel DCIV method contains two features: 1) The base current ($I_B$) of the vertical BJT is used to measure the recombination current at the interface traps generated during fabrication or operation which avoids the error from lateral distribution or areal nonuniformity of $Q_{IT}$ and $Q_{OT}$ because $I_B$ is directly proportional to $N_{IT}$ or $Q_{IT}/q$. 2) The Collector current ($I_C$) of the vertical BJT is used to measure the $Q_{OT}$ because $I_C$ increases sharply when the gate voltage passes the flat-band value toward depletion and inversion. The method will be described in this article using the nMOST and npnBJT of the BiMOS structure shown in FIG. 1. This BiMOS structure has been used previously to fabricate large test transistors wish nearly 400,000 $\mu m^2$ gate oxide area by Thompson ([8] and [9] cited in [4]), but it is also present in the submicrometer nMOST's in a p-well on n-substrate of production CMOS (Complementary MOS) inverter circuits. Thus, the novel DCIV method to be described can be easily applied to production test transistors and some examples to be given were data measured on micrometer and submicrometer MOST-BIT production structures.

With reference to FIG. 1, the BIT can be measured before and after a stress in two configurations: The top-emitter (top-E) or bottom-emitter (bottom-E) measurement configurations, with the n+drain/p-base or n+substrate/n-epitaxy/p-base as the forward biased emitter/base junction. Our geometrical terminology deviates from the traditional, emitter-up and emitter-down, which confuses the geometrical location of the emitter with the emitted-charge flow direction. In both configurations, the shape of the $I_B$-$V_{GB}$ curve and the magnitude of $I_B$ at a constant $V_{EB}$ will measure $Q_{IT}$ [5], [6]. However, we recently anticipated that the shape and magnitude of $I_C$ will also be a strong function of $V_{GB}$ in both configurations because $I_C$ increases sharply at the flat-band gate voltage, $V_{GB\text{-}flatband}$, from a low constant current t a high constant current at strong inversion voltage $V_{GB\text{-}threshold}$. This sharp increase occurs when the electron-channel between the n+drain and n+drain and n+source appears at $V_{GB\text{-}flatband}$ which abruptly increases the emitter/base area in the top-E configuration and the collector/base area in the bottom-E configuration.

The stress-induced base current, $\Delta I_B$, is solely due to electron-hole recombination at the stress-generated interface traps [5], [6], hence, is a function of stress-induced interface charge and trap concentrations, $\Delta Q_{IT}$ and $\Delta N_{IT}$, to the stress-induced density-of-states of the interface traps and surface recombination velocity, $\Delta D_{IT}$ and $\Delta S_O$. However, the increase of the collector current with $V_{GB}$ is nearly all from geometrical increase in the emitter or collector area contributed from the nMOST's electron channel. Therefore; the lateral shift in the $I_C$-$V_{GB}$ curve, $\Delta V$-GB, is mainly a function of the stress-induced change of flatband gate voltage, $\Delta V_{GB\text{-}flatband+}$ and hence is a very sensitive monitor of $\Delta Q_{OT}$+$\Delta Q_{IT}$. Thus, combining the $\Delta I_B$-$V_{GB}$ and $I_C$-$V_{GB}$ data will enable the separation of $\Delta Q_{OT}$ and $\Delta Q_{IT}$. Experimental data in the following section will demonstrate this capability of the novel DCIV method.

Minority carrier surface recombination rate or velocity $S_o$ at the Si/SiQ$_2$ interface was studied extensively since the use of MOS-gate-controlled BJT was demonstrated by one of us in 1961–1962 [5], [6]. In the early and follow-up experiments, $I_B$ was measured in either the top-emitter configuration [5]–[9] or bottom-emitter configuration [10]–[13], to evaluate $S_O$. In [7] through [9], the BJT $\beta_F$ degradation during emitter-base reverse-bias stress at the junction breakdown voltage was also studied. In many of these earlier measurements, the $I_B$-$V_{GB}$ curve was also displaced along the gate-voltage axis due to stress, but the peak in $I_B$-$V_{GB}$ was not very sharp. In some cases no peak was observed. In addition, the magnitude of $I_B$ was greatly increased by the generated $N_{IT}$. Thus, an estimate of $\Delta Q_{OT}$ from the shift of $V_{GB}$ at the peak $\Delta I_B$ in the $\Delta I_B$-$V_{GB}$ curve cannot be very accurate and reliable.

Production n-channel MOST fabricated by state-of-the-art CMOS process is measured to demonstrate the proposed DCIV method. The starting n-Si wafer has a p-base well with surface concentration of $1\times10^{16}$ cm$^{-3}$, gate oxide thickness of $x_O \cong 150$ Å, channel length L=1.6 μm, and the gate area of $A_G$=1.6×100 μm$^2$. The cross-sectional view was shown in FIG. 1.

FIG. 2(a) and (b) shows the npn-BJT's $I_B$-$V_{GB}$ and $I_C$-$V_{GB}$ curves, measured in both the top-E and bottom-E configurations, before and after SHE stress as labeled. The oxide charges and interface traps were generated by areally uniform SHE stress with $V_{SB}$=$V_{DB}$=4 V, and $V_{GB}$=7.5 V. During SHE stress, the bottom emitter junction (n+substrate/n-epitaxy/p-base shown in FIG. 1) was forward-biased to inject electrons into the p-base. Some of these electrons are accelerated (designated as hot electrons), by the reverse-biased surface space-charge layer ($V_{SB}$-$V_{DB}$=4V) of gate-induced collector/base junction area, to >3.2 eV kinetic energy. These hot electrons are then injected into the gate oxide over the 3.12 eV SiO$_2$/Si electron potential barrier. Some of the injected electrons are captured by the neutral oxygen vacancy centers [14]–[15], giving $V_O$+e$^-$→$V_O^-$ and the negative $Q_{OT}$ or positive $\Delta V_{GT}$. Because of their high kinetic energy (~4 eV from $V_{DB}$=$V_{SB}$=4V) which is greater than the bond energy (~3 eV) of the strained Si—Si and Si—O interfacial bonds and the interfacial Si—H and Si—O bonds, the hot electrons also created some new interface traps, $N_{IT}$ or $D_{IT}$, as indicated by the large increase of $I_B$ in FIG. 2(a) measure in both the top-emitter and bottom-emitter configurations. The build-up of $Q_{IT}$ also decreases the subthreshold slope of the nMOST's $I_D$-$V_{GB}$ curve shown in FIG. 2(c), however, the $V_{GB}$ shift in $I_{D\text{-}VGB}$ is due to the build-up of both $Q_{OT}$ and $Q_{IT}$ $$\Delta V_{GB} = \Delta V_{GB-OT} + \Delta V_{GB-IT} \qquad (1)$$

$$\equiv -(\Delta Q_{OT} + \Delta Q_{IT})/C_O \qquad (1a)$$

which cannot be separated by this MOST $I_D$-$V_{GB}$ measurement alone unless additional properties of the interface traps are known or assumed, a limitation also present in Terman's method to obtain $D_{IT}$ from HFCV characteristics. The two BJT measurements just described in FIG. 2(a) and (b) can help to separate the $Q_{OT}$ and $Q_{IT}$, which are analyzed as follows.

The stress-generated increase of the $I_B$ shown in FIG. 2(a) gives a direct measure of the surface recombination velocity $S_O$ and the density-of-the-state of the interface traps, $D_{IT}$ because it is proportional to the maximum of the stress induced $I_B \Delta I_B \equiv I_B$ (post-stress) $-I_B$ (pre-stress). Its peak and shape can be distorted by areal nonuniformity of $Q_{OT}$, $D_{IT}$, or other device parameters, such as base dopant concentration and oxide thickness. But areal nonuniformity alone cannot produce a base current which must come from electron-hole recombination, unlike the HFCV ($C_{gb}$-$V_{GB}$) used in Terman's analysis and the $I_D$-$V_{GB}$ in the subthreshold slope analysis of the interface trap density, whose distortion could solely arise from areal inhomogeneity even when $D_{IT}$=0.

The $V_{GB-IT}$ component can then be calculated from (2B) given below [5]

$$\Delta I_B \cong (qA_G n_i \Delta S_O/2)\exp(qV_{BE}/2kT) \qquad (2)$$

$$\Delta S_O \cong (\pi/2)\tau_O(-)_{th} \cdot \Delta N_{IT} \qquad (2a)$$

$$\Delta Q_{IT} = -C_O \Delta V_{GB-IT} \cong q\Delta N_{IT} \cong q\Delta D_{IT} \cdot \Delta E_{IT} \qquad (2b)$$

The density-of-state, $\Delta D_{IT}$ (1/cm$^2$-eV), and carrier capture cross sections, $\tau_n$=$\tau_p$=$\tau_O$ (cm$^2$), of the interface traps are assumed to be independent of the binding energy in the energy range $\Delta E_{IT}$ in the Si energy gap [16]. The calculation of $\Delta V_{GB-IT}$ is more complex than (2)–(2B) for an energy distribution of interface traps with energy-dependent density-of-state, $D_{IT}(E_{IT})$ and carrier capture cross sections, $\tau_n(E_{IT})$ and $\tau_p(E_{IT})$. However, $S_O$ calculated from measured $\Delta I_B$ after stress using (2), can still be used to monitor the build-up of the interface traps and the associated $\Delta V_{GB-IT}$. In the example shown in FIG. 2(a), the numerical results are $\Delta S_O \cong 1600$ cm/s at the $I_{B-pak}$ which occurs at the gap energy position of $V_S$-$V_F$=-0.24 V below the midgap for the top-E curve stressed with a fluence of 5×10$^{18}$ electron/cm$^2$, and $\Delta S_O \cong 40$ cm/s at $V_S$-$V_F$=-0.26 V for the bottom-E curve stressed at a fluence of 1×10$^{17}$ electron/cm$^2$. For many devices measured, $I_{B-peak}$ of the bottom-E was about five times smaller than that of top-E.

The prestress-poststress $I_C$-$V_{GB}$ curves of both the top-E and bottom-E configurations shown in FIG. 2(b) give a very sensitive measure of the stress-generated $V_{GB}$ shift. $I_C$ is flat in the accumulation range and is proportional to the area of the n+drain/p-base well junction (or the sum of the area of n+drain and n+source if drain and source are tied together during the $I_C$ measurement). When $V_{GB} \geq V_{FB} \cong -0.55$ V (Greater sign is for nMOST), an electron surface channel begins to form which will collect the electrons injected by the bottom-emitter and pass the collected electrons to the n+drain or/and n+source, causing an increase of $I_C$ ($I_D$+$I_S$). The $I_C$ quickly reaches a high plateau as $V_{GB}$ increases further to about $-0.15$V. This increase of $I_C$ is proportional to the added collector area from the gate-induced electron-channel. The three characteristic Si surface potentials of Si energy band bendings (FB=flatband at $V_S$=0 V, INV=inversion at equal electron-hole surface concentration $N_S$=$P_S$ or $V_S$=$V_F$-$V_{BE}$/2, and TH=threshold or strong inversion at $N_S$=$P_{base}$ or $V_S$=2$V_F$-$V_{BE}$) are marked by dots on the pre-stress $I_C$-$V_{GB}$ curve in FIG. 2(b). They show that $I_C$ starts to rise sharply at $V_{FB} \cong -0.55$ V at flatband in this example, reaching the higher plateau about halfway between inversion $V_{GB-inversion} \cong -0.25$ V and the MOST threshold voltage, $V_{GB-th} \cong +0.05$ V. Thus, the rise of $I_C$ is sharp and occurs in a short range of $V_{GB}$, in this case, $-0.05$ V$-(-0.55$ V)=0.5 V.

It was asserted in the preceding discussion that $I_C$ is not caused by carrier recombination or generation of the newly generated interface traps, but solely by the increase of the emitter or collector area from the gate-induced electron channel described above. This is not experimentally proven in FIG. 2(b) by the nearly parallel $V_{GB}$ shift of the post-stress $I_C$ from its pre-stress range with the nearly identical height for both the top-E and bottom-E measurement configurations, although this stress has generated a large $N_{IT}$ to give the large increase of $I_B$ shown in FIG. 2(a). This model is further supported by the observed and anticipated reduction of slope of the post-stress $I_C$-$V_{GB}$ at higher $V_{EB}$ bias reflecting a larger negative $Q_{IT}$ ($\cong \Delta D_{IT} \cdot \Delta E_{IT}$). This is expected from the higher surface electron concentration injected by the emitter to charge the interface traps negatively due to i) the added stress-induced $\Delta D_{IT}$, and ii) a larger energy range of $N_{IT}$ towards the Si conduction band edge, estimated by $\Delta E_T \sim V_{BE}$.

A quantitative analysis of the $Q_{IT}$ contribution to $I_C-V_{CB}$ shift in FIG. 2(b) can be made from $$\Delta V_{GB-IT} = -\Delta Q_{it}(V_F - V_{FN})/C_O \quad (3)$$

by using the fundamental property of intrinsic interface traps whose charge state is acceptor-like (negatively charged) near the conduction band edge and donor-like (Positively charged) near the valence band edge, because they are localized or bound electron states which are split-off states from the respective band states by random atomic location perturbation of the crystalline periodic potential at the $SiO_2$/Si interface. This charge state assignment was implied by Bardeen when he introduced the concept of neutral Fermi level $V_{FN}$[17]. For Si, $V_{FN}$ is at about $E_V+(1/3)E_G$ [17], [18]. Thus, $V_F-V_{FN} \cong 0$ at flat-band for the $_p$—Si used here which was doped with $N_{AA} \sim 10^{16}$ cm$^{-3}$ of boron acceptors, and $C_o \Delta V_{GB} \cong -\Delta Q_{QT}$. The stress induced $V_{GB-FB}$ shift in the $I_C-V_{CB}$ curves of FIG. 2(b) then gives $$\Delta N_{OT} = (C_o/q)\Delta V_{GB-OT} \quad (4)$$

$$\cong (C_o/q)[-0.2-(-0.55)] = 4.3 \times 10^{11} \text{ cm}^{-2} \quad (4a)$$

which can then be used in (1) to separate $Q_{IT}$ and $Q_{QT}$. In view of the nearly parallel shift of the $I_C-V_{GB}$ curves at low $V_{BE}$(~0.3 V in these examples), it is not necessary to locate the $V_{GB-FB}$ point to get $\Delta V_{GB-OT}$ point to get $\Delta V_{GB-OT}$ in practical applications. The change of the subthreshold slope of the MOST $I_D-V_{GB}$ slope has been commonly used to monitor $Q_{it}$. It is accurate if $N_{it}$ is areally constant. This is untenable in the practical CHE stress and can give erroneous results [4], [19].[2] In the present example, $N_{it}$ was generated by the areally uniform SHEi stress, thus, a decreasing slope of $I_D-V_{GB}$ shown in FIG. 2(c) gives an indication of a real stress-induced $N_{IT}$ rather than inhomogeneity, analogous to the reasoning for the anticipated experimental post-stress slope reduction of the $I_C-V_{GB}$ just discussed. However, an important point is frequently overlooked: $N_{it}$ or $D_{IT}(E_{IT})\Delta E_{it}$ from the $I_P-V_{GB}$ in FIG. 2(c) is in the strong inversion voltage range, $V_{GB} > V_{CB-TH}$ or in the Si-gap energy range $V_S > 2V_F - V_{BE}$(2kT/q) near the conduction band edge. In contrast, $N_{IT}$ or $D_{it}$ ($E_{it}$)$\Delta E_{it}$ in FIG. 2(b) is in the mid-range of the Si energy gap from flat-band ($V_s$=0) to strong inversion or threshold ($V_s$=2$V_F-V_{BE}$). Thus, the subthreshold slope monitors an additional energy range of $D_{IT}$ near the minority band edge, which is application-important because the MOST operates in this strong inversion range when it is turned on. But it is also fundamentally significant because the decreasing post-stress subthreshold slope [compressed by logarithmic $I_d$ but still visible in the solid curve FIG. 2(e)] indicates an increasing $D_{IT}$ with energy towards the conduction band edge, which is consistent with the commonly depicted U-shaped $D_{IT}$ as anticipated by the fundamental microscopic-atomic model of interface states implied by Bardeen [17]. A qualitative estimate from the subthreshold slope change in FIG. 2(c), using the well known equation [20] gives $$D_{IT} = (C_o/q)(_q/2.303 \text{ kT})\Delta S$$

$$\cong 10^{12} \text{ cm}^{-2}_c V^{-1}$$

Additional examples are given in FIG. 3(a)–(e) for the bottom-Emitter configuration which use $I_C$ to monitor negative, positive, and turn-around $\Delta Q_{QT}$ induced by stress.

FIG. 3(a) is identical to FIG. 2(b) showing positive $\Delta V_{CB}$ from negative $\Delta Q_{GB}$ after SHEi stress (curve 2) with $V_{GB}$= 12 V and $V_{DB}=V_{SB}$=10 V, due to positive $\Delta Q_{QT}$, as anticipated [15] by the electron-impact emission of electrons trapped at the neutral oxygen vacancy, $V^{(\ )}+c^o \rightarrow V_{(\ )}+2e-$. FIG. 3(c) demonstrates the successive stresses that gave negative $\Delta Q_{QT}$ first and then positive $\Delta Q_{QT}$, which is the so-called turn-around effect coined by Young [21]. Curve 1, showing positive $\Delta V_{GB}$, was measured after a short (~1 s) CHEi stress at $V_{GB}=V_{DB} \cong 15$ V with the source floating, indicating negative $\Delta Q_{QT}$ due to capture of the electrons injected into the oxide along the entire length of the strongly inverted n-channel because $V_{GB} >> V_{TH}$. Curve 2, showing negative $\Delta V_{GB}$, was measured after an additional 500 s stress, indicating that some originally trapped electrons (not the captured electrons during the short stress) are emitted via a second pathway, the impact emission just described for FIG. 3(b).

The stress condition used in FIG. 3(c), with source floating or shorted to drain, approximates that in BJT under emitter-base junction reverse-bias stress. Thus, the bottom-emitter measurement configuration can be used to study the fundamental degradation mechanisms in BJT even without a separated gate over the emitter-base junction [3].

The sensitivity of this new DCIV is demonstrated experimentally in FIG. 4 which gives a sensitivity limit or minimum measurable $S_O$<~1 cm/s and $N_{IT} \leq 10^9$ cm$^{-2}$.

SUMMARY OF THE INVENTION

A new direct-current current-voltage (DCIV) method for separating the oxide charge and interface traps in oxidized silicon is presented. The inventive method has several unique features difficult to attain previously. 1) It is a purely dc method resulting in ease of instrumentation and extremely high detection sensitivity 2) It gives. true $D_{IT}$, not affected by inhomogeneity and hence usable for profiling $D_{it}$ and $Q_{IT}$. 3) It has very high $D_{IT}$ sensitivity in presence of large $Q_{OT}$. 4) It is applicable to submicrometer area devices in conventional production CMOS and nMOST junction well structure. 5) It can monitor the degradation kinetics of both MOST's and BJT's.

Several demonstrations are given to illustrate the simple and high-sensitivity of the DC-IV method for monitoring the variation of the electrical characteristics of submicron silicon MOS transistors during channel hot carrier stress. Examples are given on interface traps generated during channel hot electron and hole stress of submicron nMOST's and pMOST's with 0.35 to 100 micrometer channels from quarter-micron (1996) to two-micron (<1990) technologies.

The simple and high-sensitivity d.c. current-voltage 9DCIV) method was first employed nearly four-decades ago to characterize surface recombination and channel on silicon transistors [1]. It was recently reintroduced by Neugroschel and Sah [2], to measure the volume and areal densities of oxide ($N_{OT}$) and interface traps ($N_{it}$) in stressed silicon MOS and bipolar junction transistors (MOST's and BJT's). The DCIV is a plot of the base or body terminal-current versus the gate-base or gate-body voltage. Its high sensitivity derives from the common-emitter current gain, beta, of the bipolar junction transistor 9BJT) which also exists in all MOST structures. In contrast to the gated-diode method (gain=1) [1]. The DCIV method has been applied rather successfully by Neugroschel and Sah and their graduate students to delineate the mechanisms-origins and to analyze the kinetics of interface and oxide trap generation by energetic or hot carriers, and to predict the ten-year operation time-to-failure (TTF$_{OP}$) of deep-submicron silicon n-channel and p-channel MOS transistors (nMOST's) and pMOST's) under channel hot electron (CHE) or hole (CHH) stress [3]. It was also used by them to characterize deep-submicron silicon npn and pnp BJT's [4] and germanium-silicon-based DJT's [5], stressed by reverse emitter-base biases. Recently, the DCIV method was used in an experimental verification of a new two-parameter bond-breaking theory of interface trap generation [6], and in a demonstration of the current-accelerated channel hot carrier stress methodology to shorten the 10-year $TTF_{OP}$ determination from about three years to 18-days [7]. This paper provides several demonstration examples of the DCIV method applied to Si nMOST's and pMOST's manufactured by 2-micron 1990 and quarter-micron 1996 technologies, using computer-controlled data acquisition equipment such as the HP4145 and HP4156.

FIG. 5 shows the drain-emitter DCIV bias configuration (the other is the source-emitter to measure $N_{QR}$ and $N_{IT}$ near the source) of a stressed nMOST in p-well on p+substrate, which is to be measured by the DCIV method to give the $I_B$–$V_{GB}$ characteristics.

The $SiO_2$/Si interface traps (open triangles) were generated over the drain/channel junction space-charge region and over the n-channel region during the CHE stress from hot carriers breaking the hydrogen bonds (Si:H and SiO:H), $I_B$ contains two emitter (not shown) and six base recombination components, the latter from p-well holes recombining with the drain-emitter injected electrons at the electron-hole (e-h) recombination centers or interface traps located in the six regions. They are distinguished by one alphabetic and one numeric subscript: c-channel region, s=surface space-charge region, b=bulk space-charge region; 1 and 2 from $I_B \cong \exp(qV_{BE}/nk_BT)$ where n=1 for Shockley's ideal p/n junction diode law and n=2 for the ideal Sah-Noyce-Shockley (SNS) space-charge-layer recombination law. Fom left to right in FIG. 5, these are: (1)$I_{B-c1}$ over the n-channel region, (2) $I_{B.\_2}$ over the surface space-charge region of the drain/body junction along the n-channel-perimeter, (3) $I_{B-b2}$ in the drain/body junction's bulk-space-charge region, (4) $I_{B-b1}$ in the drain/body junction's bulk-quasi-neutral region, (5) $I_{B-b2}$ same as (2) but outside of the n-channel-perimeter, and (6) $I_{B-c1}$ same as (1) but outside of the n-channel-perimeter. For studying kinetics and mechanisms, and extrapolating $TTF_{OP}$, the channel component, $\Delta I_B = \Delta I_{B-c1} + \Delta I_{B-2}$, generated by channel hot carriers (electrons), must be plotted against the channel hot carrier stress fluence. $I_{channel-hot}xi_{stress}$/qxArea. $\Delta I_B$ is obtained from $I_{B-stress}$ vs $V_{GB}$ and $I_{B-prestress}$ vs $V_{GB}$ curves, and similarly, $I_{channel-hot}$ from $\Delta I_D = I_D - I_{D-no-channel-hot}$ vs $V_{GB}$.

FIGS. 6(a)–(d) show a sample set of stress-and-measure 9SAM) DCIV data of long-, short-, n- and p-channel MOST's with W/L=100/100, 20/20, 17.5/0.35 and 20/0.7 $\mu m^2$.

The Is measured at the low drain-emitter forward-bias (O4V) follows the n=2 SNS law indicating c-h recombination at the interface traps located in the drain junction surface-space-charge region, $I_{B.s2}$. Higher drain-emitter forward-bias gives the n=1 component from the interface traps in the channel region, $I_{B-c1}$. The stress-generated base current, $\Delta I_B$ (n=2), increases linearly with stress-time or stress-fluence initially, as $t^{1/2}$ at intermediate fluence, and toward a constant at long stress time. The appearance of the two peaks depends on channel length and technology. The growth rates of the two peaks, keeping the stress voltage $V_{stress}=V_D-(V_G-V_T)$ constant, were also very different. The threshold stress voltage was determined for several MOST designs using the two-parameter bond breaking model proposed by SAH [6], 1.87V for a npnBJT and 3.06V for both the long-channel nMOST's and pMOST's , which were thought to be dependent on the gate oxide-technology and channel-impurity-profile as anticipated by the theory. Based on these considerations, the fast-growing peak is tentatively identified as the Si.interface trap from breaking the Si:H bond by the channel hot carriers while the nearly constant or slow-growing peak, the SiO. interface trap from breaking the SiO:H bond.

FIGS. 7(a) and (b) illustrate the application of the DCIV method for extrapolating the 10-year $TTF_{OP}$ using the current-accelerated CHE and CHH stress methodology (CACHE and CACHH), based on the TTF criteria of $\Delta I_B/I_B$=+100% for (100/100) nMOST and 20% for (20/20) pMOST. The $\Delta I_B$ is proportional to the subthreshold-leakage current or standby-power failure in mega-transistor CMOS circuits. The fluence-to-failure (FTF) in FIG. 3(b) is computed from FTF=$\int \Delta I_D dt/qA_{drain}$ where $\Delta I_D$ is the channel hot electron current component of the total drain current during stress with ($V_{BE-stress}$>0) or without ($V_{BE-stress}$=0) acceleration for the nMOST datapoints in FIG. 3(a). $A_{drain}$ should be the channel cross-sectional area, however, the drain contact area was used for normalization. $TTF_{OP}$ is obtained from $TTF_{OP}$=FTF/($I_{D-no-acceleration}$/$qA_{drain}$.

The following table gives the SAM times (not including data analysis time) to determine the 10-year $TTF_{OP}$ using current-acceleration up to 50×. It can be further sped up by 20× using the two-parameter theory.

nMOST CACHE and CHE SAM Times

| Stress | CACHE | | CHE | |
|---|---|---|---|---|
| $V_{DS}$ Volt | Stress | Meas. | Stress | Meas. |
| 7.0 | 1.4 m | 50 m | 21 m | 1.8 h |
| 6.5 | 3.3 m | 1.0 h | 2.8 h | 3.3 h |
| 6.0 | 28.8 m | 2.5 h | 11.5 h | 3.8 h |
| 5.5 | 3.9 h | 2.8 h | 56.3 h | 4.5 h |
| 5.0 | 38.7 h | 6.0 h | *556 h | 6.0 h |
| 4.5 | 365. h | 9.3 h | *22.8 kh | 9.3 h |
| Subtotal | 408.2 h | 22.4 h | *23.4 kh | 29.7 h |
| TOTAL SAM –computed | 430.6 hours (–18 days) | | 23,456.7 hours (–977 days) | |

Application of the DCIV method is described for rapid evaluation of the degradation of deep-submicron nMOSTs and pMOSTs under channel hot carrier stress. At a 50× current-acceleration the 10-year operation time-to-failure was obtained from data taken in 430 hours (18 days-3 weeks) instead of 977 days (–3 years).

The D.C. Current-Voltage method is demonstrated as a diagnosis monitor to evaluate process variations and device designs of silicon n-channel and p-channel Metal-Oxide-Semiconductor Transistors (MOSTs) fabricated from 0.35-micron and advanced sub-0.25-micron technologies. Source-drain asymmetry, areal nonuniformity, residual interface trap density-location-energy-level, minute variation of dopant impurity concentration at the drain-channel and source-channel perimeters under the gate oxide, and well-body and contact defects are measured by the gate-voltage variation of the base recombination currents via interface traps and p/n-junction tunneling. The minority carriers injected by a forward-biased junction serves as the sensitive probe for measuring the interface trap properties. Demonstrations of all the combinations of forward or zero bias applied to the two or three p/n junctions of generic MOST designs for CMOS are presented The DCIV measurement method described above to measures the volume density of oxide traps ($N_{OT}$ in $cm^{-3}$) and areal density of interface traps ($N_{IT}$ in $cm^{-2}$) in electrically stressed silicon bipolar-junction and metal-oxide-semiconductor transistors (BJTs and MOSTs). Due to industrial interests on using the DCIV method to evaluate the operation time-to-failure ($TTF_{OP}$) of the transistor fabrication technology and device design to meet the ten-year $TTF_{OP}$ requirement of integrated circuit chips, the DCIV method has been implemented in the HP4156A (Hewlett-Packard D.C. Parameter Analyzer) by customized turn-key control-programs stored on the HP4156A diskette with a user manual giving demonstrations of the stress-and-measure (SAM) experiments on nMOST and pMOST from 0.35–2.0 micron technologies fabricated during the past decade (1988–1997). Applications of the DCIV method included lateral profiling of the interface traps, evaluation of the hydrogen bond-brealting theory of interface trap generation, separation of the interface and areal nonuniform oxide traps, linear dependence of stress-induced drain-saturation current on the stress-generated DCIV base current, reliability of transistors with low-K interconnect materials, reduction of interface trap density in p-channel MOS transistors during channel-hot-hole stress due to hydrogenation of silicon dangling-bond interface traps over the channel by hydrogen released by hot holes from hydrogenated boron acceptors in the p+drain region, a most important manufacturing application: interface trap generation by current-accelerated channel hot carrier stress to reduce the $TTF_{OP}$ determination time by 100-fold from six-month or more to less than 100 hours, and reduced hot-carrier degradation rate from using deuterium annealing. The purpose of this memorandum is to illustrate a new application of the DCIV method, the diagnosis of the transistor design and fabrication technology before stress. Examples on ~3 nm and ~5 nm gate-oxides are given for state-of-the-art and future sub-0.25-micron CMOS technologies.

DETAILED DESCRIPTION OF THE PREFERRED EMBODIMENTS

FIGS. 8–22 clearly show the distinct differences between the base current, IB, measured from the drain-emitter (DE), source-emitter (SE), and bulk bottom-emitter (BE) bias configurations. For the DE-DCIV, there are two peaks in long-channel nMOST and pMOST, one growing with stress and the other nearly fixed; and there is only one observable peak in the short-channel nMOST which grew with stress. For SE-DCIV, there is only one fixed peak in the long-channel and short-channel nMOST: and there are two fixed peaks in the long-channel pMOST. For BE-DCIV, there is only one fixed peak in the long-channel nMOST and a decreasing peak in the short-channel pMOST as predicted by Sah's hydrogen-bond-breaking theory.

The similarities and differences between the DE-DCIV, SE-CIV and BE-DCIV curves provide a rapid determination of the properties of the interface traps, including their spatial location, energy levels, and fabrication process dependencies. A number of examples are described below.

Spatial Location of CHC-Generated Interface Traps (1) In all three MOSTs, the long-channel nMOST (FIG. 10) and pMOST (FIG. 13) and short-channel nMOST (FIG.

16), the DE-DCIV growing peak (blue) indicates increasing SiO2/Si interface-trap density over the drain-junction space-charge region. This is expected and verified by the SNS (Sah-Noyce-Shockley) theory with n=2 in IB-peak exp (qIVDBI/nkBT) from electron-hole recombination at interface traps in the junction space-charge region at the 0.4V forward junction bias. This is consistent with that expected from hydrogen-bond (or any weak-bond) breaking by the energetic carriers accelerated in the high-field drain-junction space-charge region.

(2) The constant peak in the DE-DCIV-curve (FIGS. 10 and 13) of both long-channel nMOST and pMOST indicates nearly constant SiO2/Si interface-trap density in the middle part of the channel during CHC stress. This was verified by the ideal Shockley diode law, n=1in IB exp(qVDB/nkBT), and is expected from the surface energy band bending and the recombination of the drain-junction injected minority carriers with the base-body-well majority carriers.

(3) In the short-channel nMOST the DE-DCIV curve (FIG. 16), there is no visible fixed (second) peak as those in the long-channel LMOST and pMOST of (2). This indicates that if interface traps are generated in the mid-channel location in this short-channel nMOST, its density is low and not observable at the VDB=−0.4V n+drain/p-body forward bias. This was indeed verified by DE-DCIV curves obtained at higher forward VDB.

(4) The SE-DCIV curves of the long-channel MOSTs (FIGS. 10 and 13) show no visible change with increasing stress fluence, indicating little interface traps generated in the source junction and in the mid-channel region during CHC stress.

(5) The SE-DCIV curves of the 17/0.35 nMOST (FIG. 16) increases with stress, indicating some interface traps were generated in the mid-channel (n=1) during CHC stress.

Figure 1:
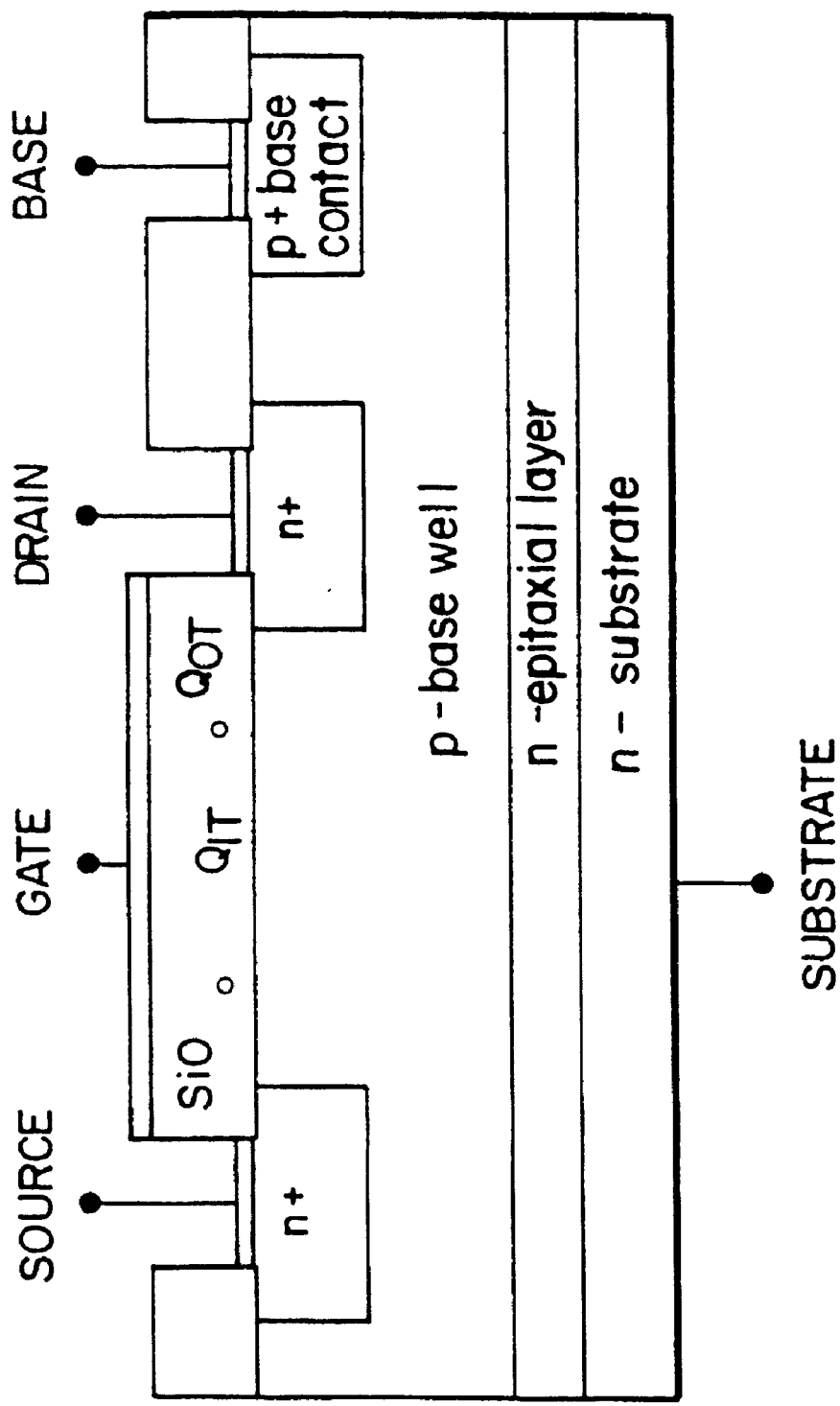
FIG. 1 is a cross-sectional view of the BiMOS BJT-MOST transistor structure with a nMOST in a p-base well on a n-epitaxy/n+ substrate silicon wafer with the parasitic n+/p/n+ BJT.
Figure 2A:
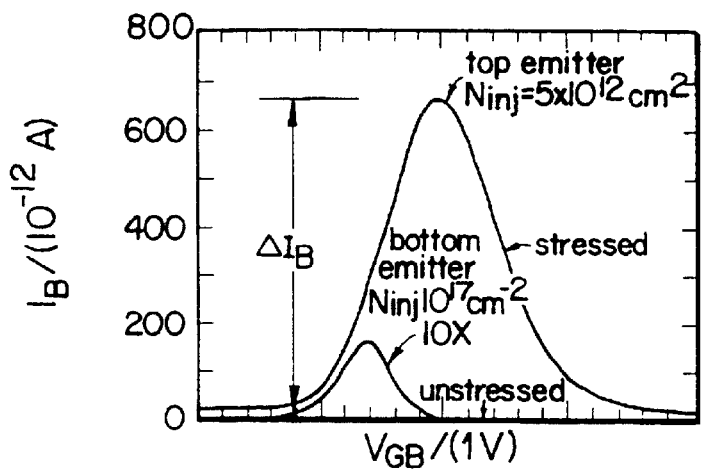
FIG. 2 is a graph depicting the effect of area-uniform SHEi stress on the npnBJT and nMOST characteristics as a function of the MOS gate voltage.
Figure 2B:
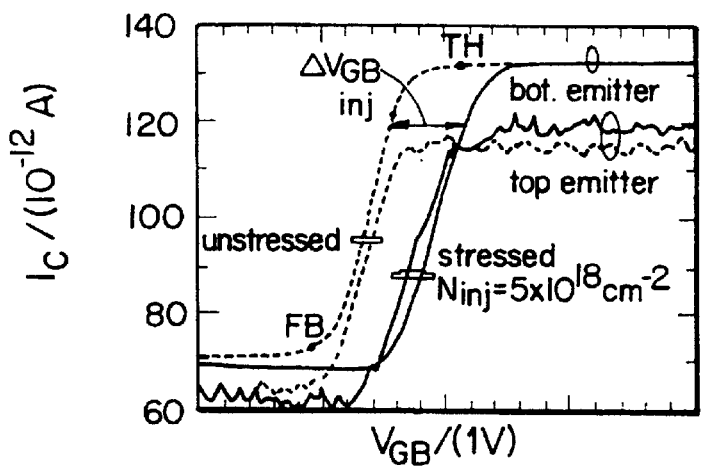
Figure 2C:
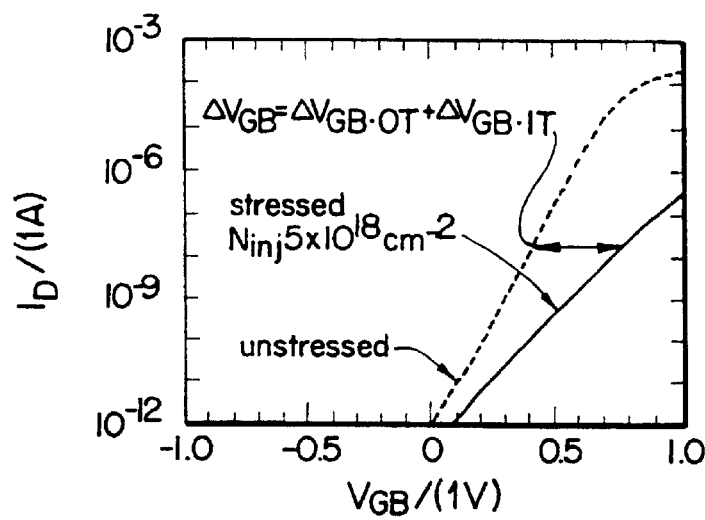
Figure 3A:
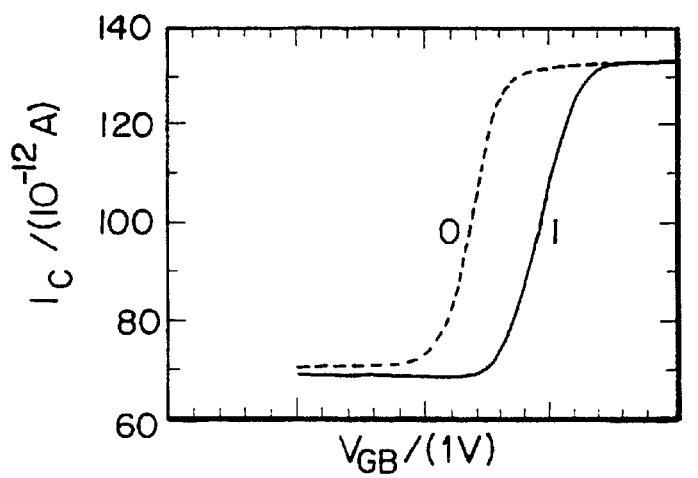
FIG. 3 is a graph depicting the effect of stress on collector current.
Figure 3B:
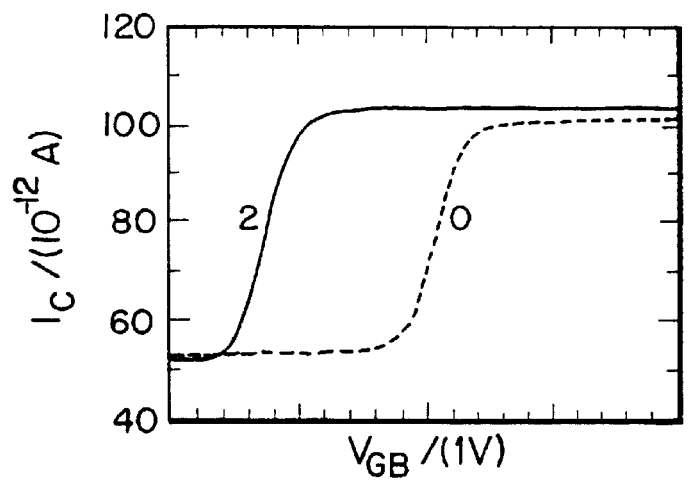
Figure 3C:
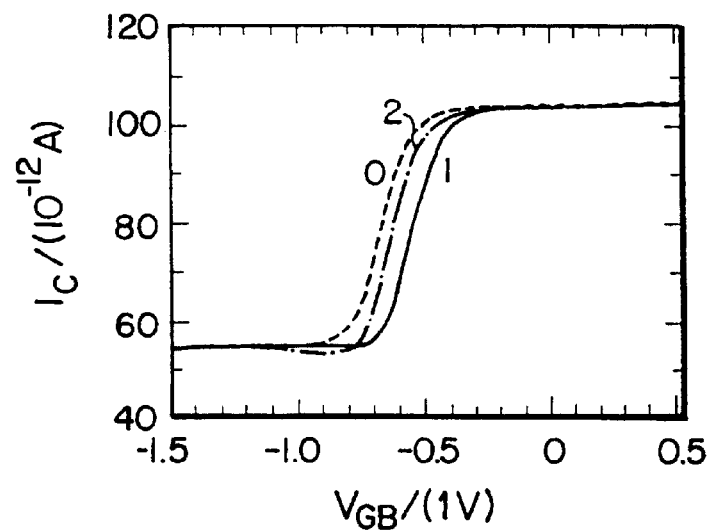
Figure 4:
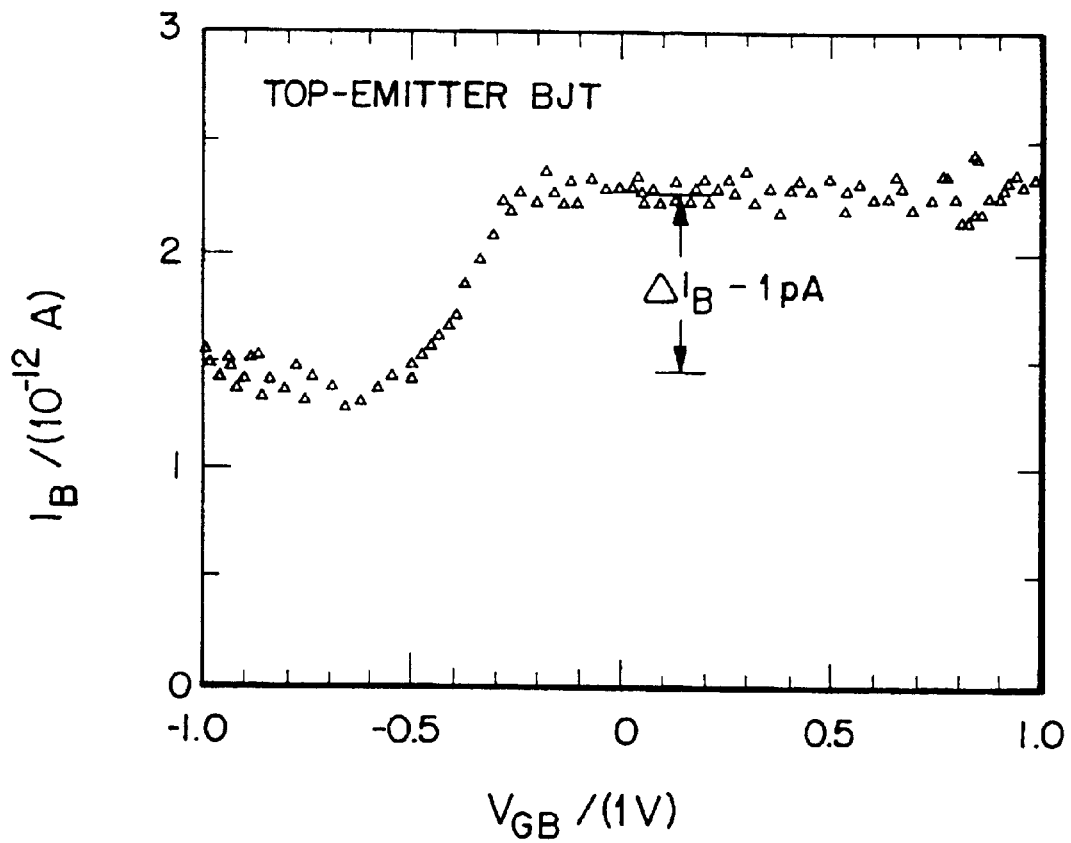
FIG. 4 is a graph depicting a sensitivity test of the top-emitter $I_B$ measurement of interface traps of an unstressed BiMOS.
Figure 5:
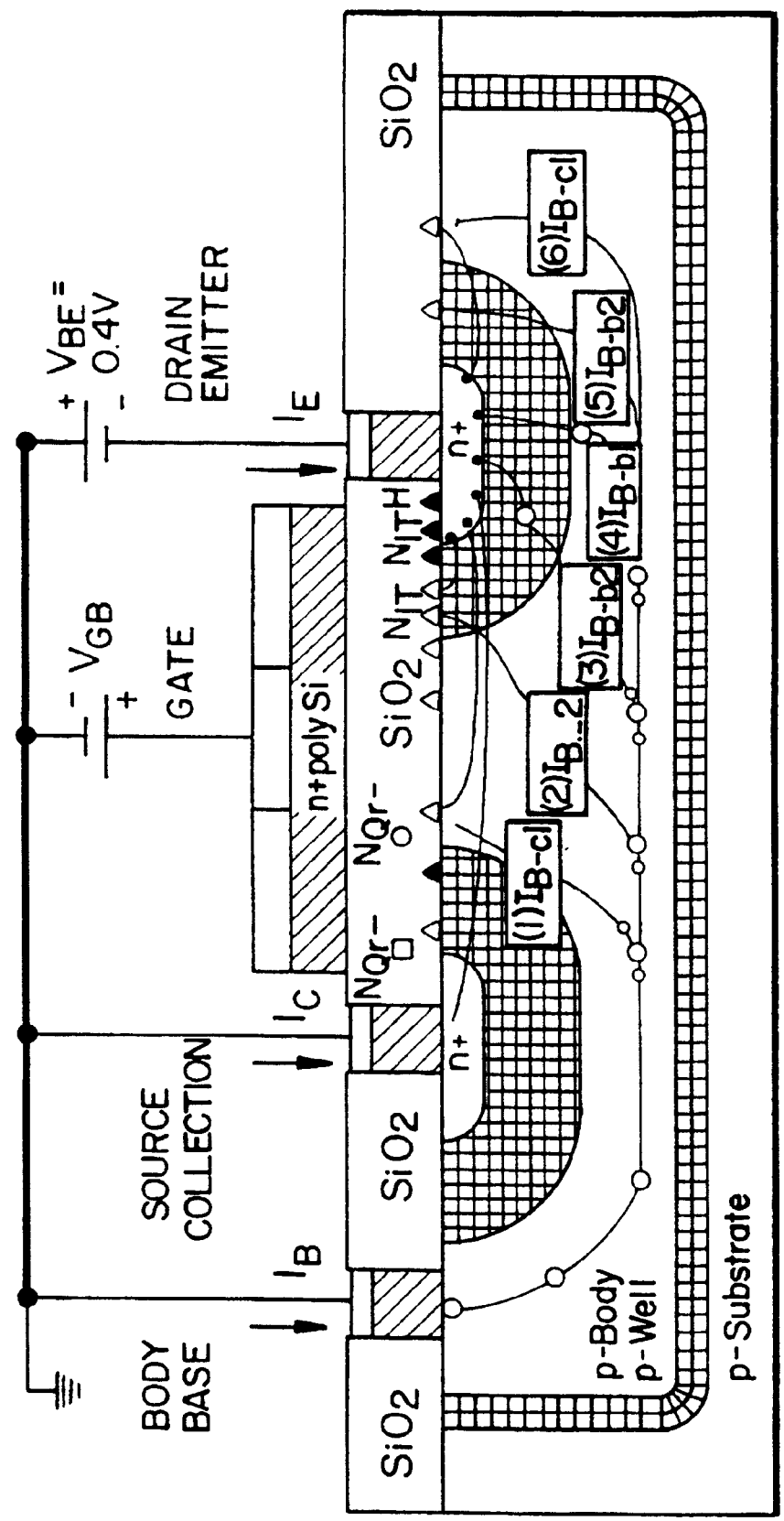
FIG. 5 is a cross-sectional view of a stressed nMOST
Figure 6A:
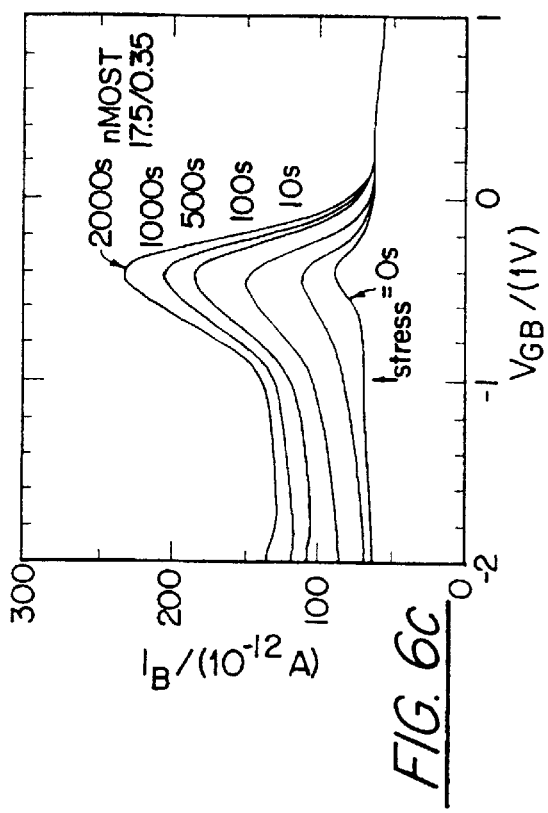
FIGS. 6(a)–(d) illustrate a sample set of stress-and-measurement DCIV data of long-, short-, n- and p-channel MOSTs.
Figure 6B:
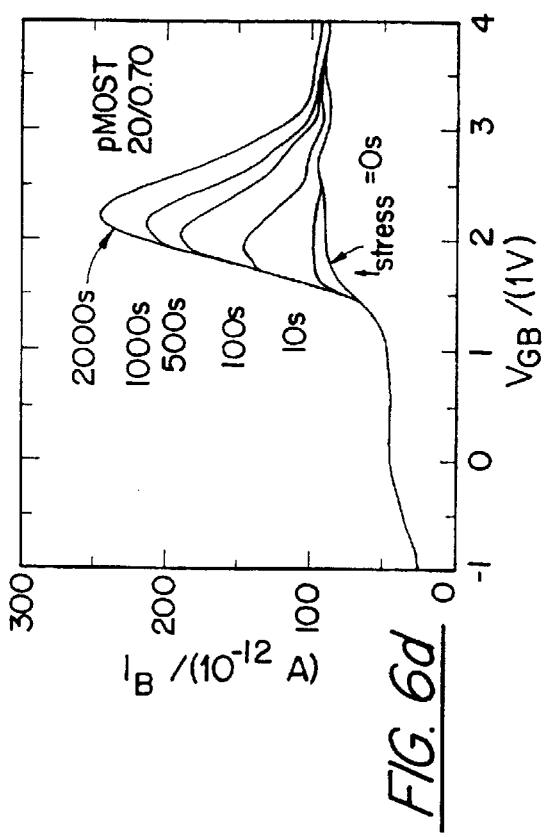
Figure 6C:
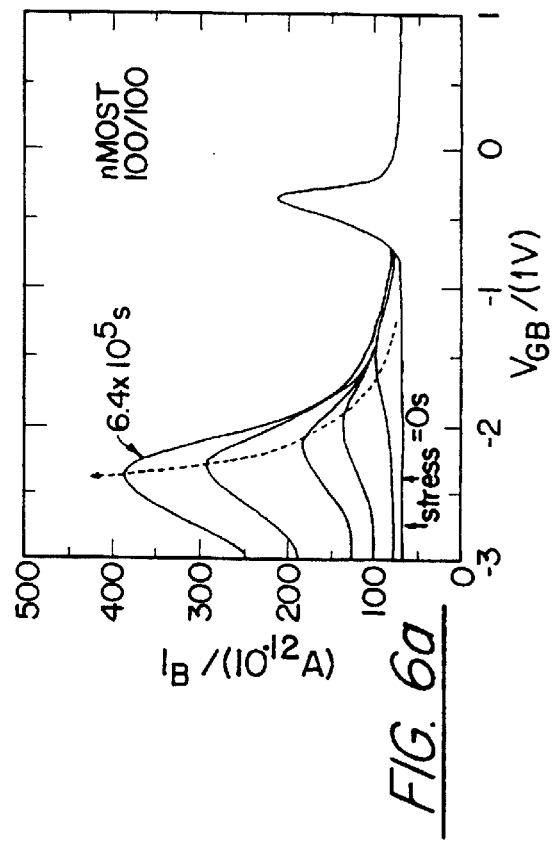
Figure 6D:
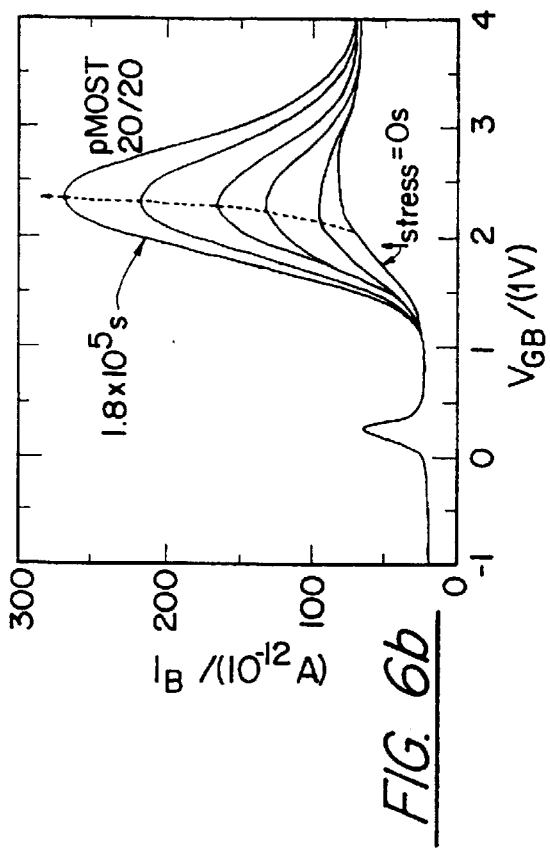
Figure 7A:
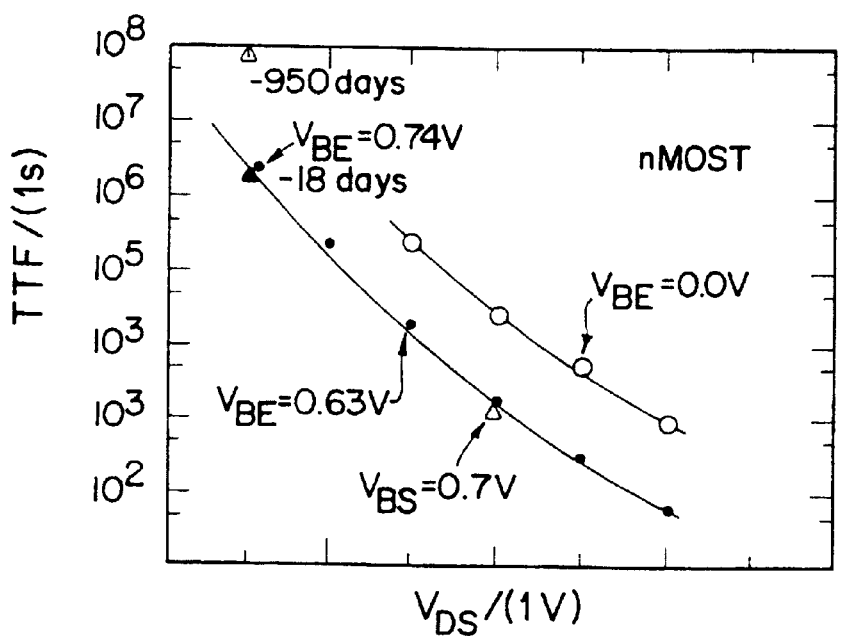
FIGS. 7(a and b) provide a graphical representation of the $TTT_{OP}$ extrapolation algorithm.
Figure 7B:
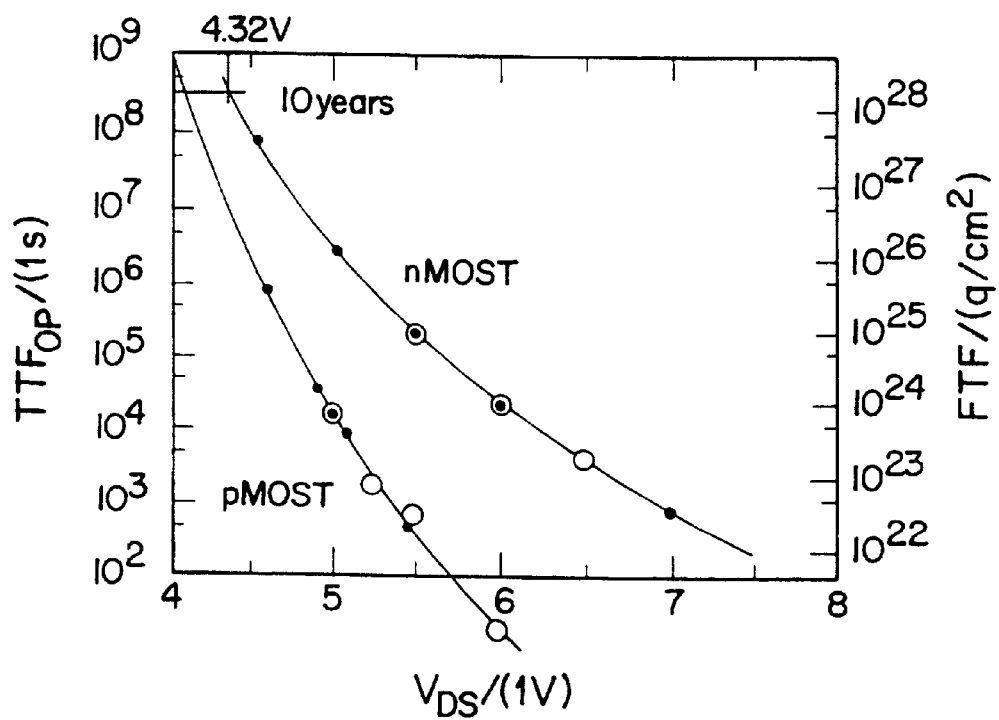
Figure 8:
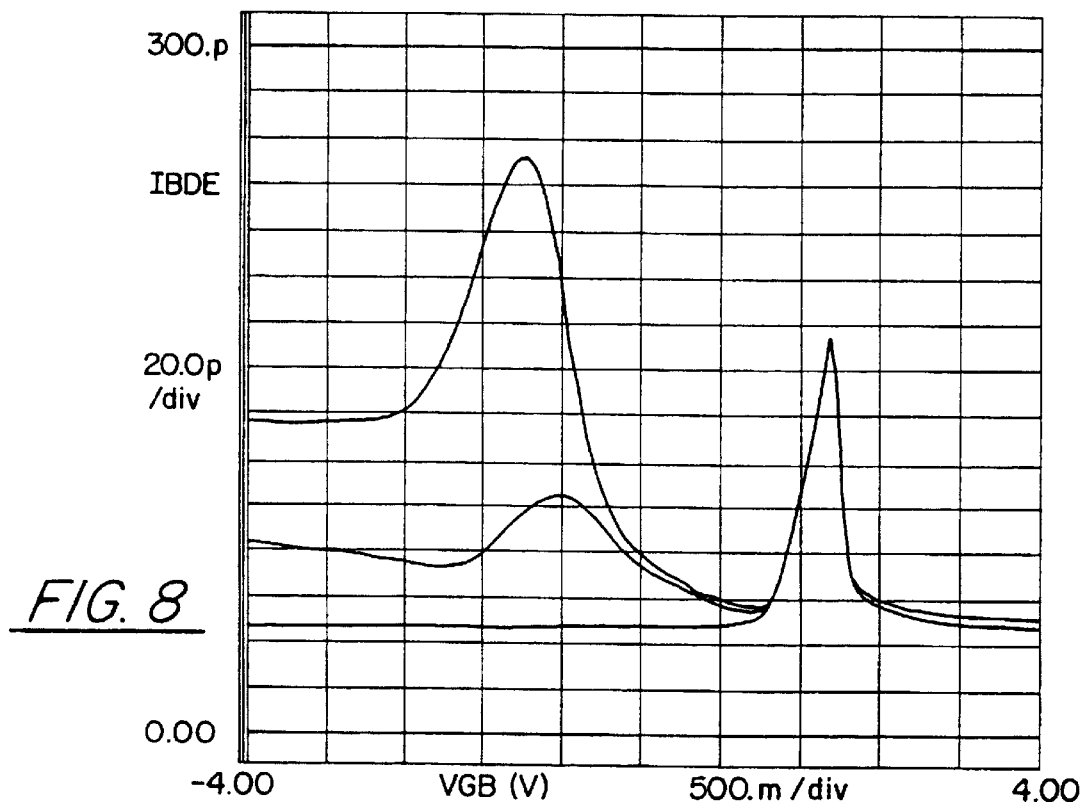
FIG. 8 is a graph depicting DE-DCIV curves.
Figure 9:
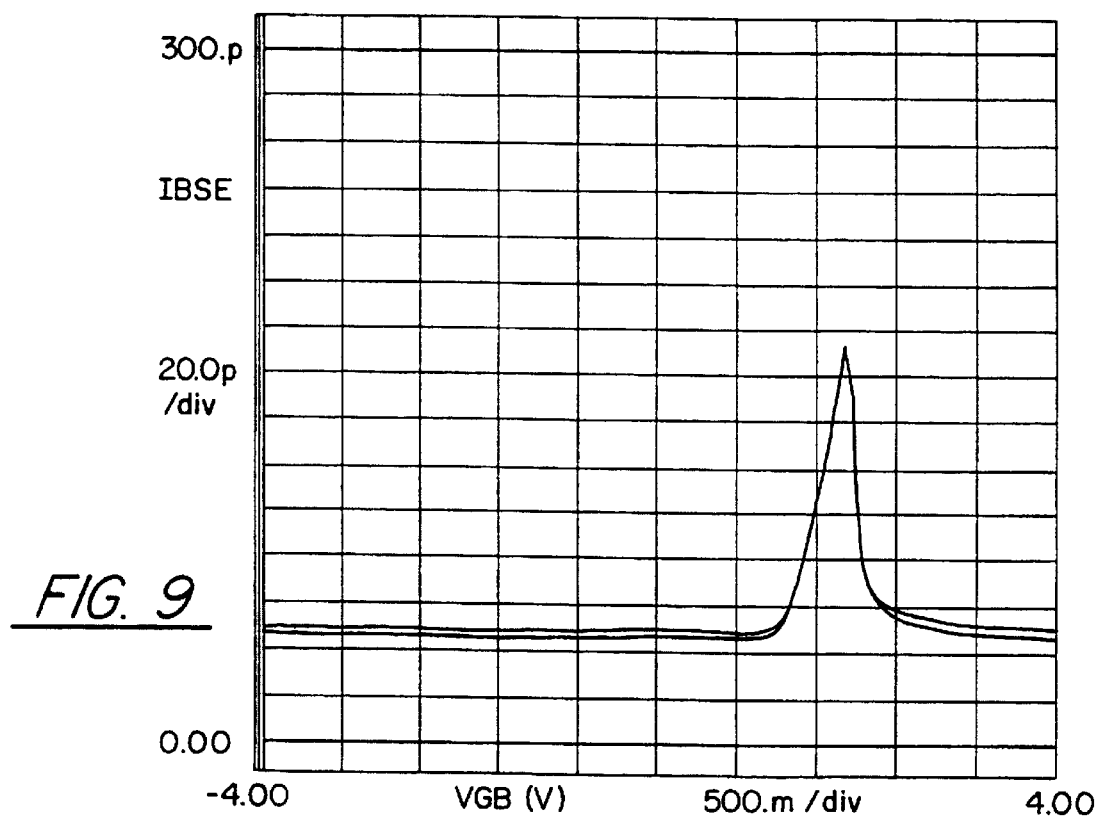
FIG. 9 is a graph depicting SE-DCIV curves.
Figure 10:
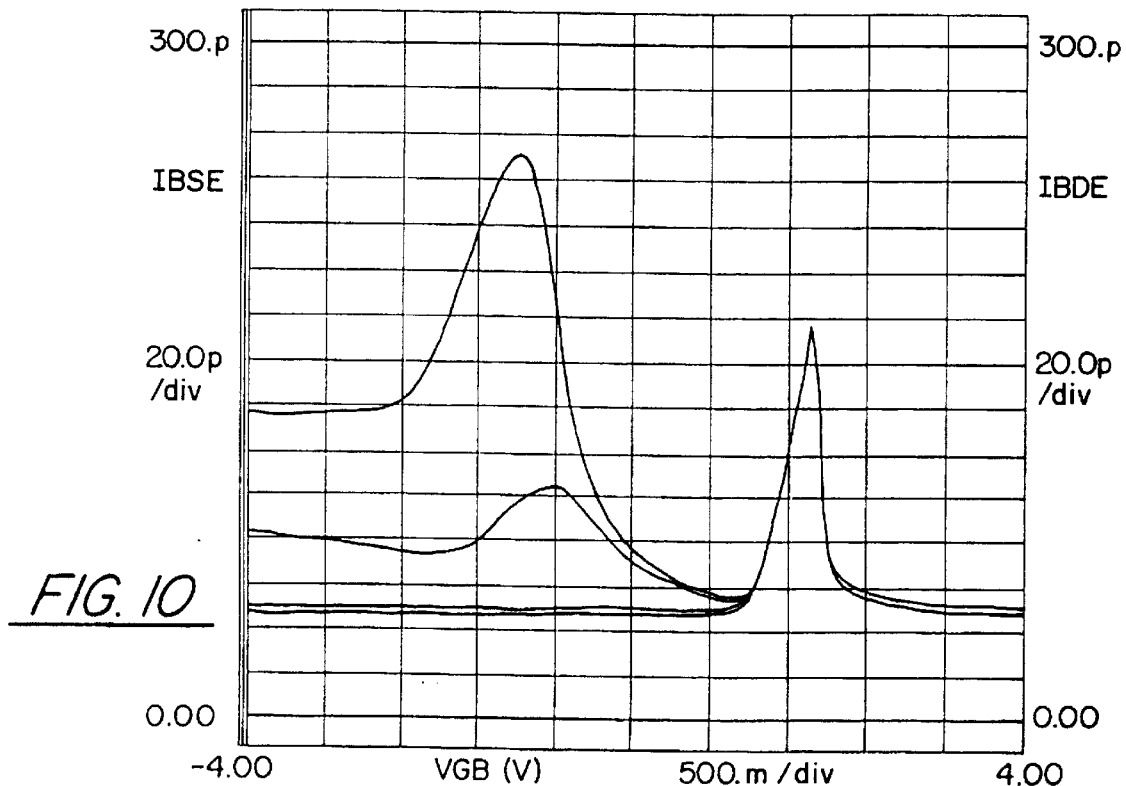
FIG. 10 is a graph depicting SEDE-DCIV curves.
Figure 11:
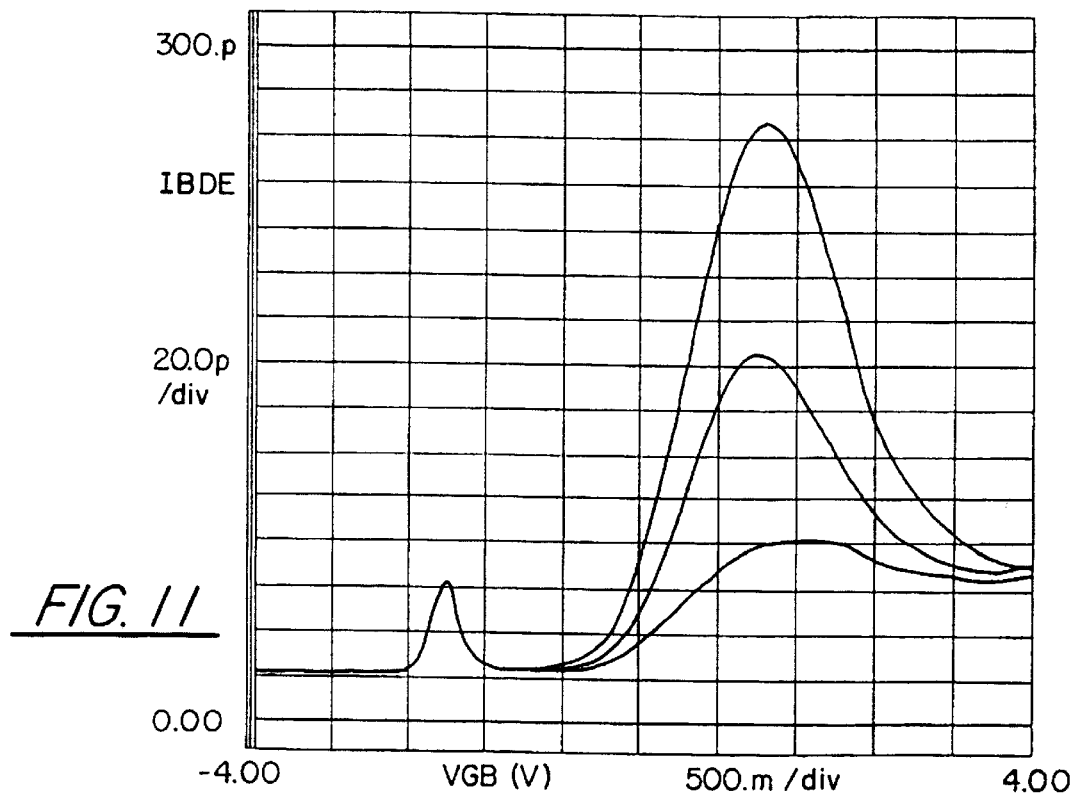
FIG. 11 is a graph depicting DE-DCIV curves.
Figure 12:
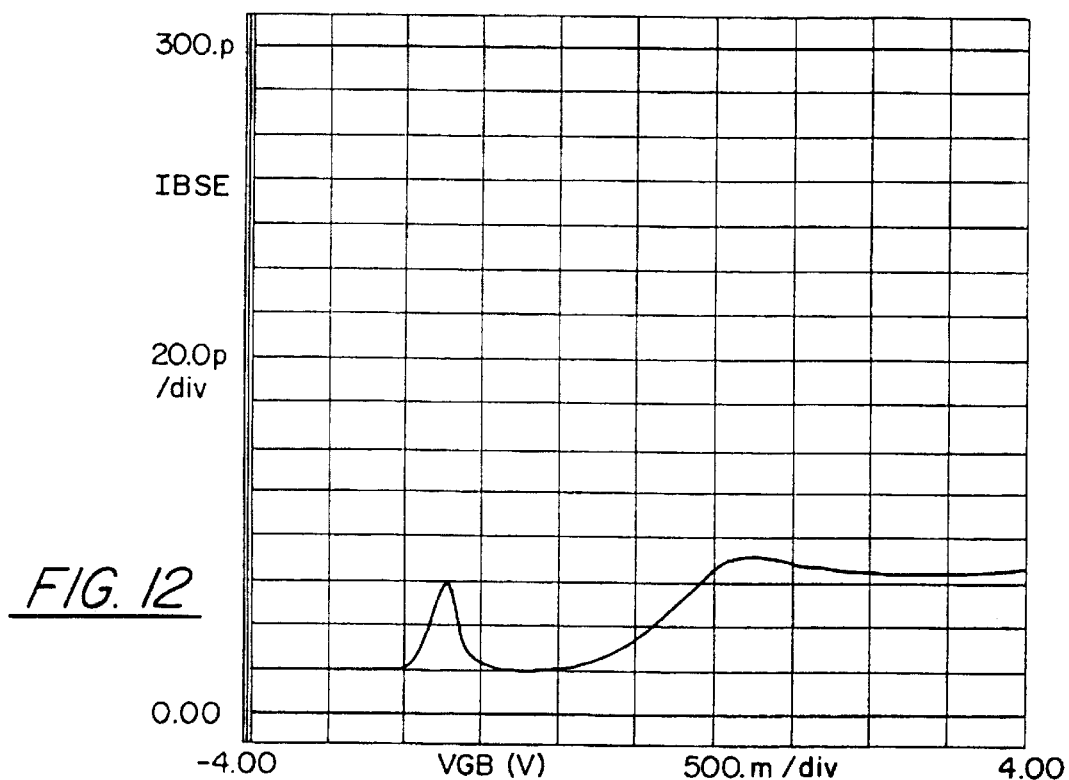
FIG. 12 is a graph depicting SE-DCIV curves.
Figure 13:
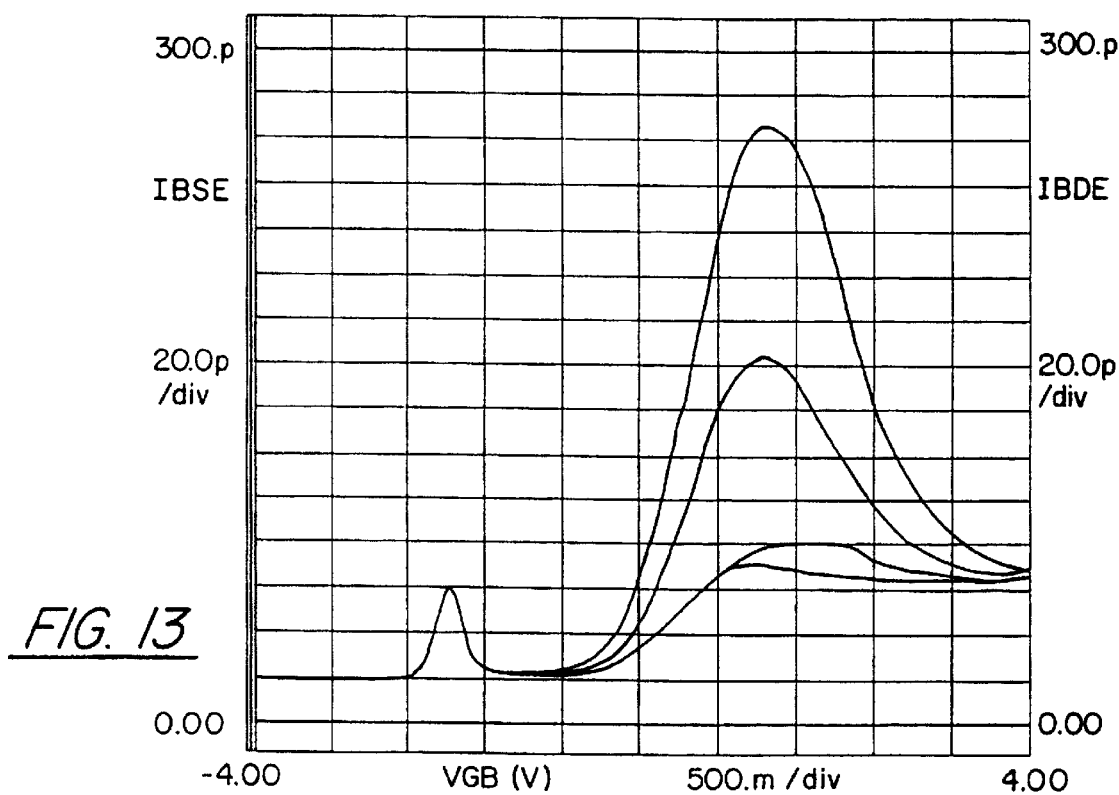
FIG. 13 is a graph depicting SEDE-DCIV curves.
Figure 14:
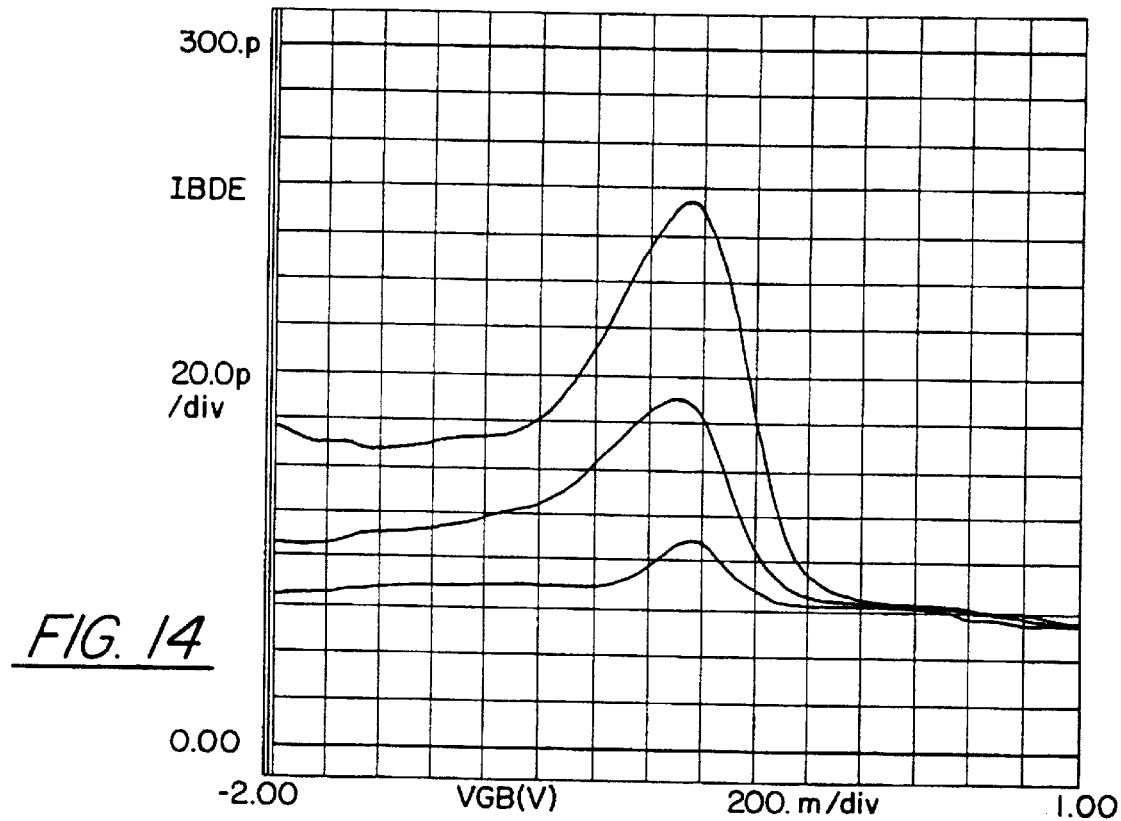
FIG. 14 is a graph depicting DE-DCIV curves.
Figure 15:
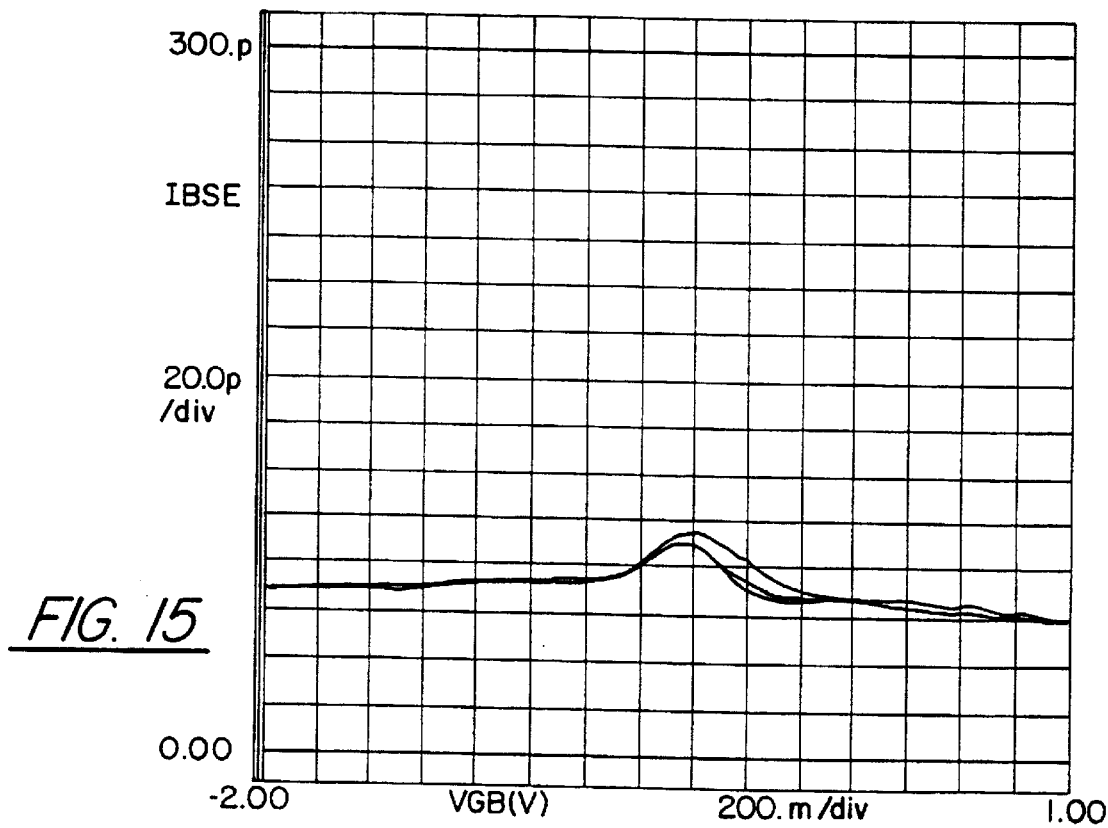
FIG. 15 is a graph depicting SE-DCIV curves.
Figure 16:
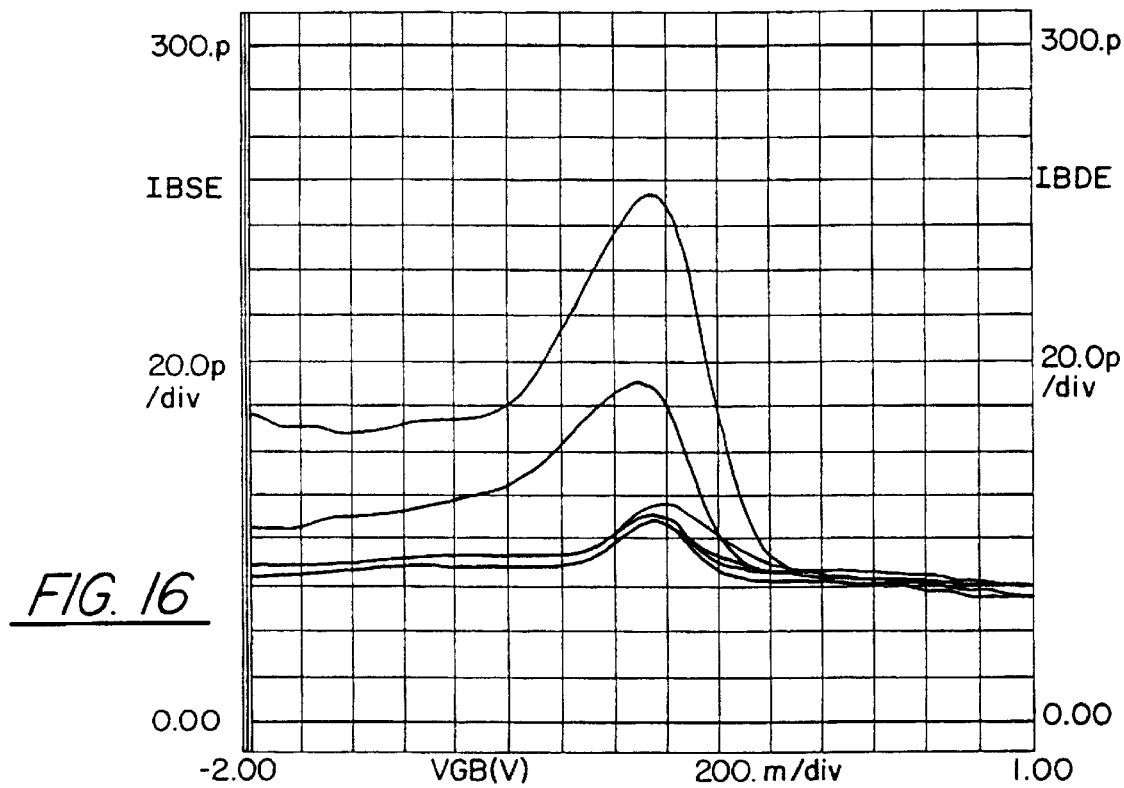
FIG. 16 is a graph depicting SEDE-DCIV curves.
Figure 17:
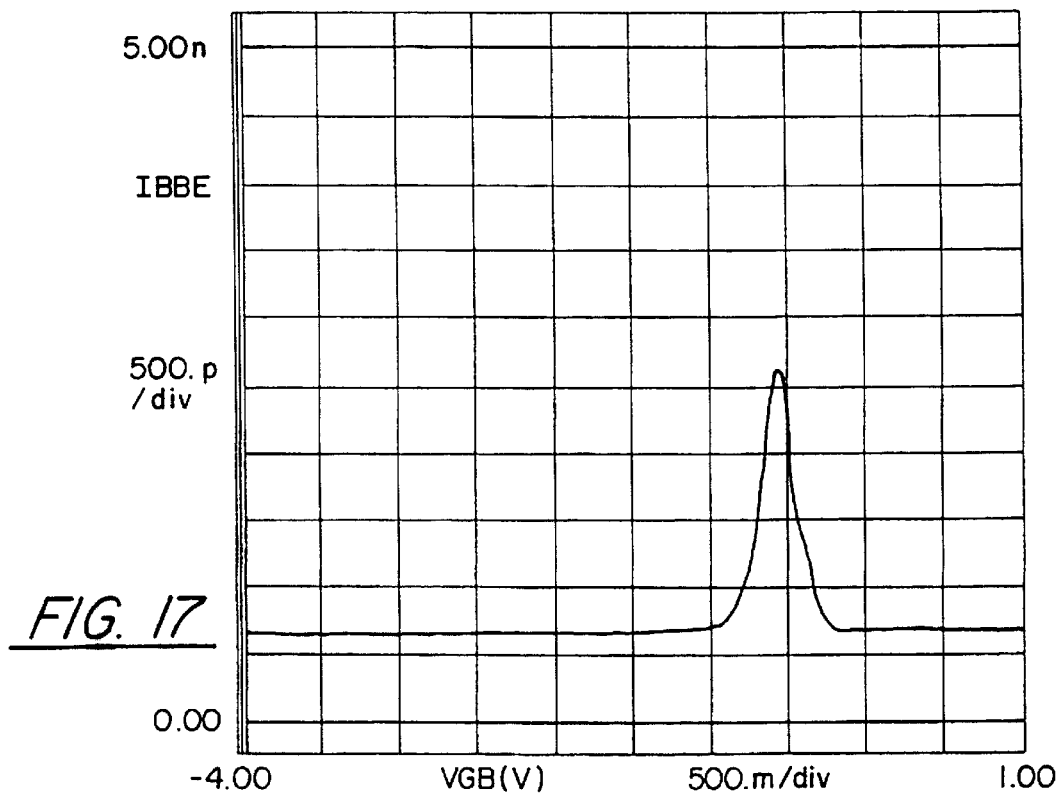
FIG. 17 is a graph depicting BE-DCIV curves.

Residual Interface Traps from Fabrication Processes (6) Result of (2) also states that there are considerable residual interface traps in the mid-channel region (n=1) from fabrication processes of the 20/20 pMOST and the 100/100 nMOST and this is true also in the 17/0.35 nMOST (prestress blue curve in FIG. 9).

(7) The prestress SE-DCIV curve of both 20/20 pMOST and 17/0.35 nMOST (FIGS. 13 and 16) show also a non-growing peak at the same gate voltage as that of the growing DE-DCIV peak of these two MOSTs. This indicates that the technologies produced considerable residual interface traps in the source (also drain) junction space-charge layer.

Detection of Drain-Source Asymmetry (Drain-Source Engineering or Areal Inhomogeneity)

(8) The noticeable difference between the prestress SE-DCIV curves at VGB=+2.25V of the 20/20 pMOST (FIG. 13) suggests a drain-source engineering difference, if this difference is not due to areal nonuniformity. The almost similar peaks of the 17/0.35 nMOST suggest identical drain-source engineering.

Interface Trap Energy Level in the Silicon Energy Gap (9) The non-growing DCIV peak from the mid-channel range gives the more accurate estimate of the energy level of the interface trap. For all three MOSTs, the peak appears in the subthreshold ID-VGB curve.

Oxide Trap Charging

(10) The rather small initial relative then positive gate voltage shift (ΔVGB-peak) of the growing DE-DCIV peak of the 20/20-pMOST and 17/0.35-nMOST (FIGS. 13 and 16) indicate a small positive then negative charging of the oxide trap (ΔQOT) over the drain junction space-charge region during CHC stress. The slight +ΔVGB-peak of the small growing SE-DCIV peak of the 17/0.35-nMOST (FIG. 16) indicates a small −ΔQOT over the mid-channel region. Similarly, the unobservable ΔVGB of the non-growing IB peak of the two long-channel MOSTs (FIGS. 10 and 13) indicate no observable oxide trap charging (ΔQOT=0) over the mid-channel region. The noticeable negative ΔVGB of the growing peak of the 100/100 nMOST (FIG. 10) indicate +ΔQOT over the drain junction space-charge region during CHC stress Bottom(Bulk)-Emitter Applications

(11) The BE-DCIV curve of the 100/100 nMOST (FIG. 17) shows only one observable peak and there is no observable increase. The n-factory also confirmed its ideal Shockley diode current origin. These affirm that this fixed IB peak is due to e-h recombination at the interface traps located at the mid-channel region. The IB current component (holes) from e-h generation at the interface traps located in the space-charge layer of the zero-biased or reverse-biased source and drain junctions is many orders of magnitude (depending on the forward bottom-emitter bias) smaller than that from e-h recombination which can only occur in the quasi-neutral region such as the mid-channel.

Figure 18:
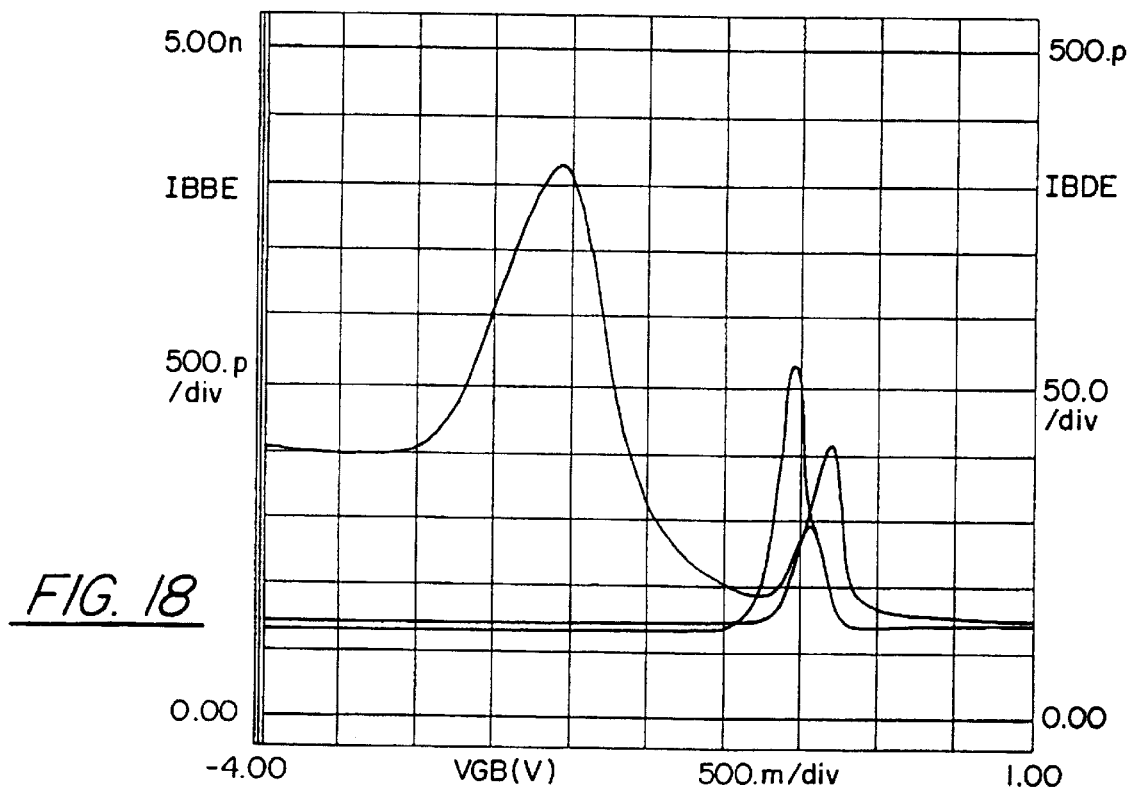
FIG. 18 is a graph depicting BE-DCIV curves.
Figure 19:
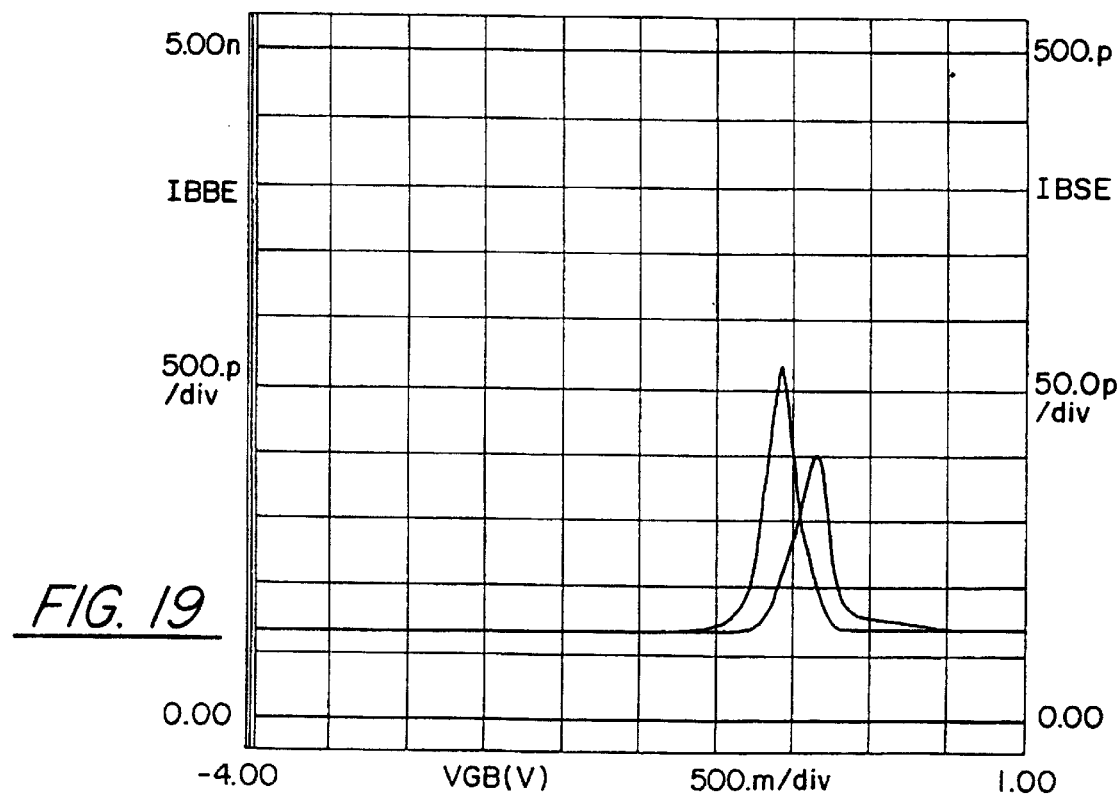
FIG. 19 is a graph depicting BESE-DCIV curves.
Figure 20:
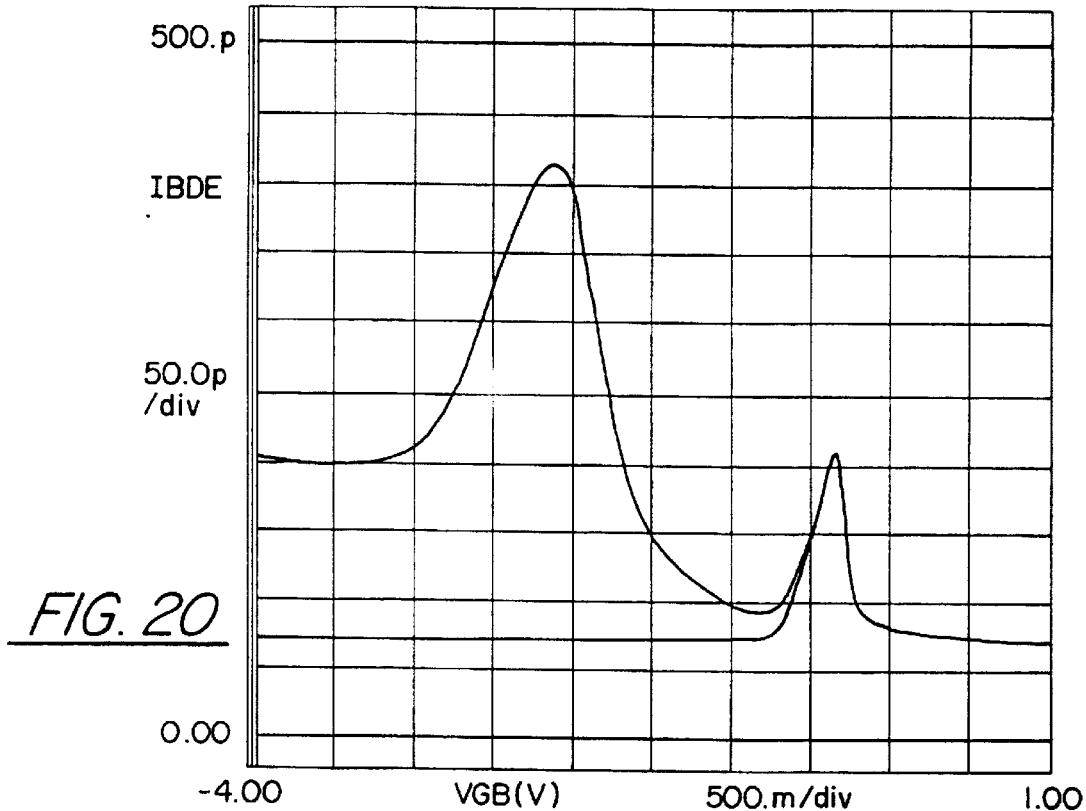
FIG. 20 is a graph depicting DE-DCIV curves.
Figure 21:
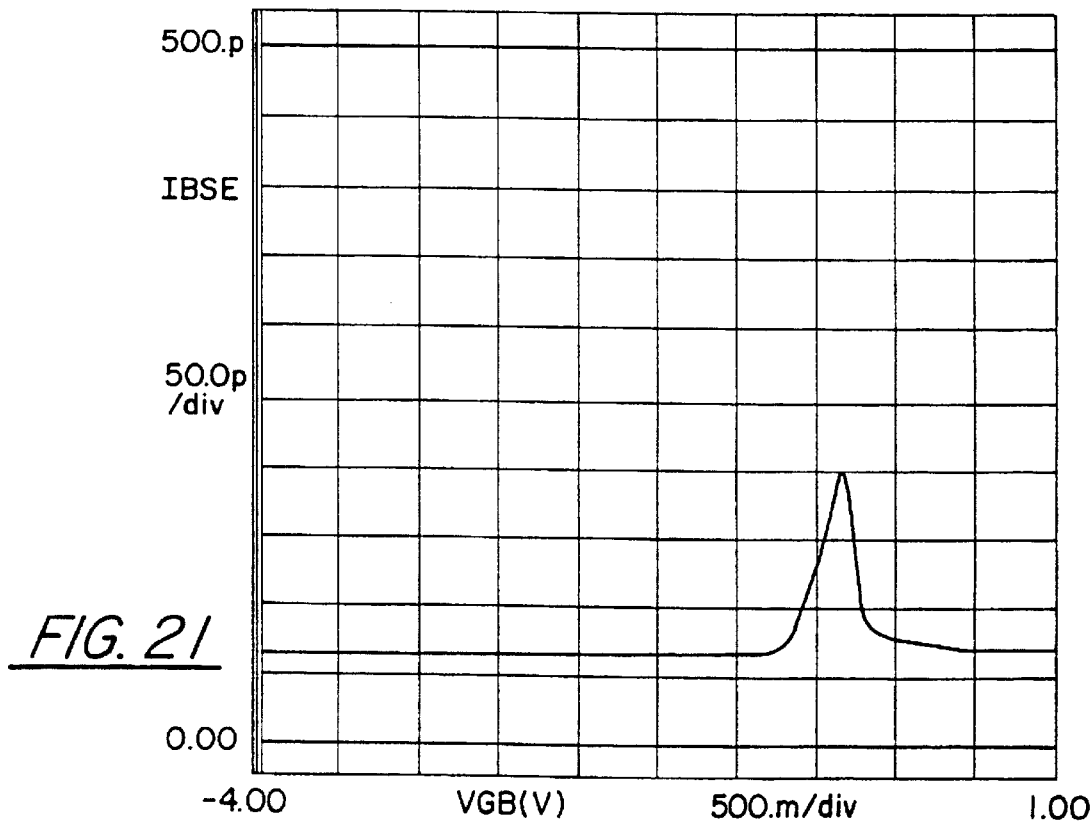
FIG. 21 is a graph depicting SE-DCIV curves.
Figure 22:
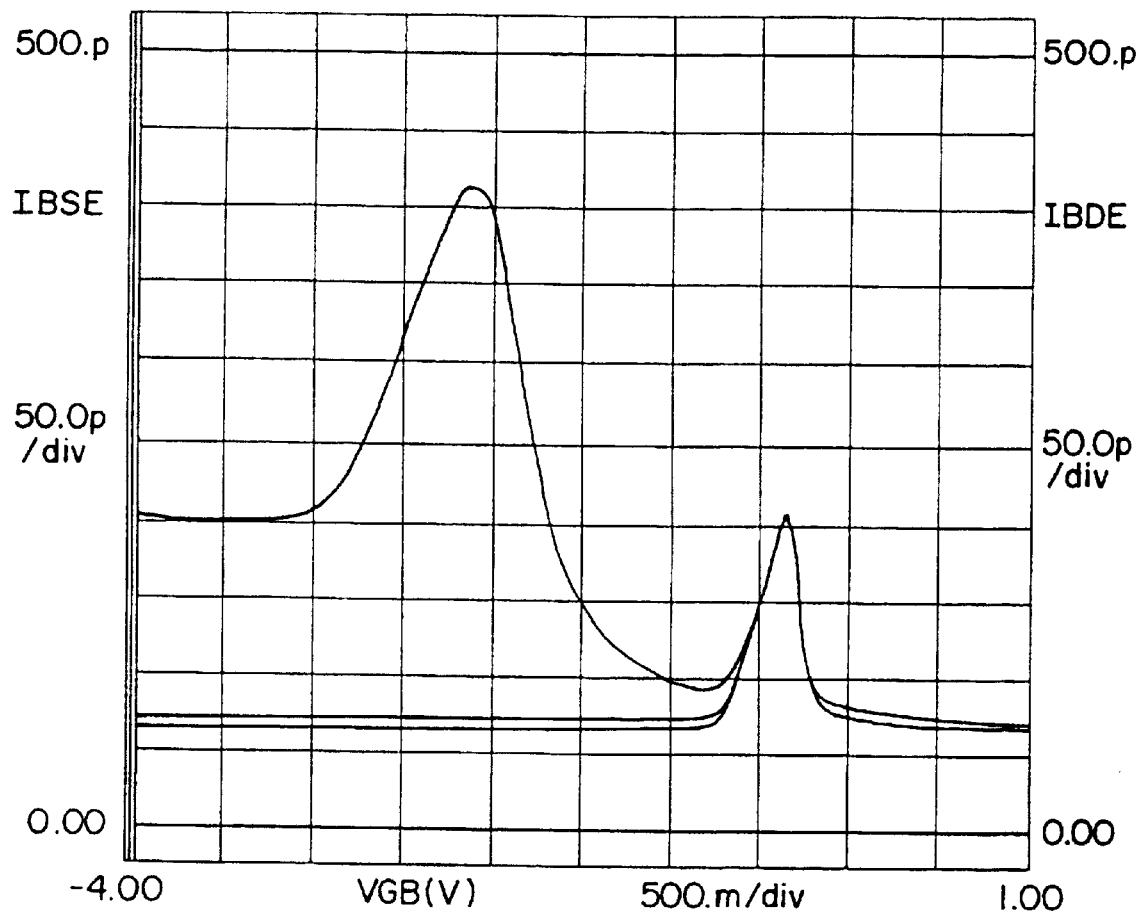
FIG. 22 is a graph depicting SEDE-DCIV curves.

(12) The BE-DCIV/DE-DCIV comparison in FIG. 18 shows similar features as that of the SE-DCIV/DE-DCIV comparison in FIG. 22 except the VGB location of the IB peak of the SE-DCIV or DE-DCIV is shifted positively relative to that of the BE-DCIV. This understood as follows. The shape and position of the IB peak is determined by the lateral (source-to-drain) variation of the concentration of three species: boron acceptors (from drain engineering), interface traps (from hydrogen diffusion profile), and injected minority carriers (short diffusion length). Only the last would give the observed positive gate voltage shift which is consistent with the interface minority carrier (electron) concentration decay due to small diffusion length.

Basic Principles of DCIV

The DCIV method leverages the MOS >field-effect= modulation of the bipolar transistor actions (minority carrier injection, and minority carrier recombination with the majority carriers at the interface traps) to monitor the gate-oxide/silicon-channel interface properties. It gives a graph of experimental base or body terminal current, $I_B$, versus the gate-base voltage, $V_{GB}$, with one of the transistor's p/n junction forward-biased to inject and increase the minority carrier concentration which increases the sensitivity, and with some of the nearby p/n junctions short-circuited to serve as the collector junctions of not-recombined minority carriers which could provide a higher differential sensitivity.

The metal-oxide-silicon transistor (MOST) contains at least two p/n junctions (the source and drain) and four contact pads on a chip or wafer and four terminals in a package (the source, drain, gate, and body or well-substrate wafer). For CMOS (complementary MOS) technology on p-type Si (p-Si) wafers, the p-channel MOS transistor (pMOST) is an n-well and contains three p/n junctions (the p+source/n-well, p+drain/n-well and n-well/p-wafer junctions). For the bipolar CMOS (BiCMOS) technology on p-Si wafer with an n-well, with or without an n+Si buried region, the nMOST in hte p-well/n+buried-layer contains the three p/n junctions (the n+source/p-well, n+drain/p-well, and p-well/n-well) and a fourth p/n junction (n-well/p-wafer) which is short-circuited and not used by the DCIV method.

The minority carriers (electrons in the p-well of an nMOST), injected by the forward-biased source, drain, or well-body emitter junction, recombine with the majority carriers (holes in the p-well or p-wafer) at the $SiO_2/Si$ interface under the gate to give the gate-voltage dependent base-terminal current, $I_B$, which is proportional to the density of interface traps under the gate oxide. Because of this gate-voltage dependence, there is no ambiguity on the interface-trap origin of the peaked structures observed in the base terminal current, $I_B$. The ease of the DC base current measurement and its unambiguous interface-trap-density proportionality were leveraged in the recently proposed and demonstrated reliability monitor of transistors underwent channel and substrate hot carriers (CHC and SHC) stress to determine the bias conditions to meet the 10-year circuit $TTF_{OP}$ criteria. The salient feature of the DCIV method is its tremendously enhanced detection sensitivity from forward-biasing one of the p/n junctions of the MOST structure to serve as the emitter/base junction of the lateral or vertical bipolar-junction transistor (LBJT and VBJT) in order to inject minority carriers into the base-body well and the $SiO_2/Si$ interface under the gate-oxide. At an applied forward PN junction voltage of $VP_N$ the minority carrier density is increased by $\exp(qV_{PN}/kT)$. Thus at $V_{PN}=357.13$ mV and kT/q=25.85 mV (T=300K), the sensitivity is increased by $\exp(qV_{PN}/kT)=\exp(357.13 \text{ mV}/25.85 \text{ mV})=\exp(13.816)=10^6$ over the reverse-biasedjunction-leakage-current method. This memoranda demonstrates the obvious new application of the DCIV method, namely, as the pre-stress monitor for diagnosis of fabrication technology and device design, which is facilitated by the increasingly higher sensitivity of the new current measurement instruments and meters, from 1 pA in HP4145B to 1 fA in HP4156B and going down to 0.1 fA (100 aA) and 0.01 fA (10 aA=60 electrons per second) resolutions in off-the-shelf atto-ampere (atto=$10^{-18}$) electrometers (Keithley 6517A).

Results

3.1 Transistor Used

Figure 23:
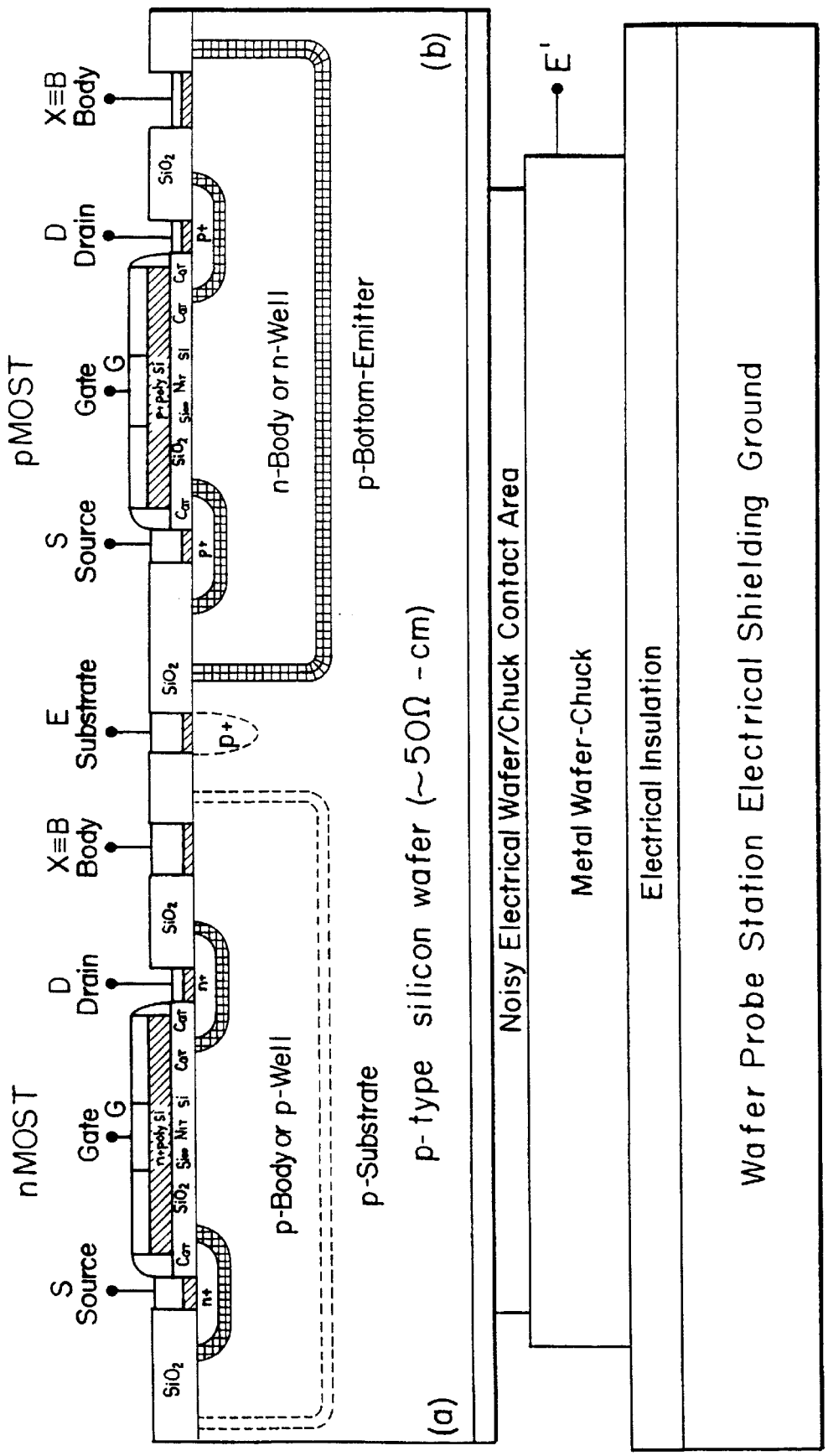
FIG. 23 is a cross-sectional view of generic CMOS transistors.

The data presented here were taken on silicon MOS transistors of the latest two technology generations: the advanced sub-0.25-micron and production 0.35-micron technologies, with ~3 nm and ~5 nm gate oxides as defined in Table 14 on page 46 of the December-1997 edition of the SIA Semiconductor Technology National Roadmap. Both were fabricated using the 0.35-micron CMOS technology on 8-inch 50-ohm-cm ($2.5\times10^{14}$ boron/$cm^{-3}$) p-type wafers with ion-implanted source, drain and well junctions and $1-5\times10^{17}$ $cm^{-3}$ well-impurity concentration at the $SiO_2/Si$ interface. Transistors from each generation with two drawn gate-width/channel-length ratios were measured in order to also illustrate the application of the scaling law to the DCIV methodology: W/L ($\mu m/\mu m$) 12.5/12.6 and 12.5/0.40 for the sub-0.25-micron and 20/20 and 20/0.4 for the 0.35-micron technologies. The cross-sectional view of the NMOST and pMOST are shown in FIGS. 23(a) and (b).

3.2 Measurement Instrumentation

The DCIV data were taken using a HP4156A (1 fA sensitivity) or a custom stress-and-measure (SAM) station consisting of a 19-inch rack with rack-mounted and pro-grammable (via IEEE-488 bus) digital voltage sources, microvolt and femto-atto-ampere meters, scanners, and low-leakage Reed relays. The HP4156A and SAM station are controlled via the IEEE488 bus by FORTRAN programs running on a MicroVAX-2 minicomputer running Open-VMS 5.5-2 operating system. The data are stored and analyzed in a DECNETed VAX-4096 workstation. The 8-inch test-transistor wafers were probed by a donated wafer probe station (WPS) modified by us for manual operation. Low-noise cable-and-wiring (CAW) practice is followed to connect the WPS to the HP4156A or SAM. The WPS has no temperature control, thus, offset currents arisen from contact-potential-differences of the various metal/metal junctions of the CAW connectors at different temperatures must be subtracted. This subtraction is easily and rather accurately made by software during data analysis or plotting when the minute residual ground-loop currents (1–10 fA) become appreciable compared with the measured base and gate currents.

3.3 Lateral BJTs

Experimental results and elementary device-material-physics based explanation are given in this section (3.3) for prestress data taken in the lateral BJT bias configurations. Results from the vertical BJT bias configurations are given in the following subsection (3.4). More advanced and detailed explanations are given in later sections.

3.3.1 Base-Recombination Current versus Gate Voltage

Figure 24A:
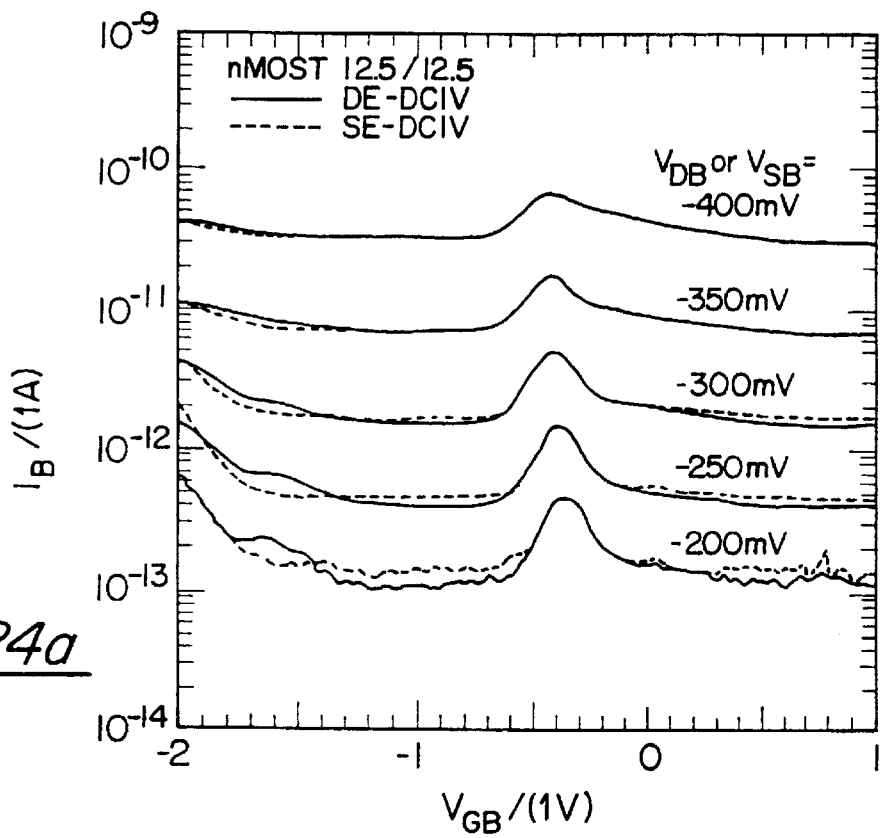
FIGS. 24(a and b) are curves depicting the DE-DCIV and SE-DCIV of a prestressed long-channel silicon nMOST and pMOST.
Figure 24B:
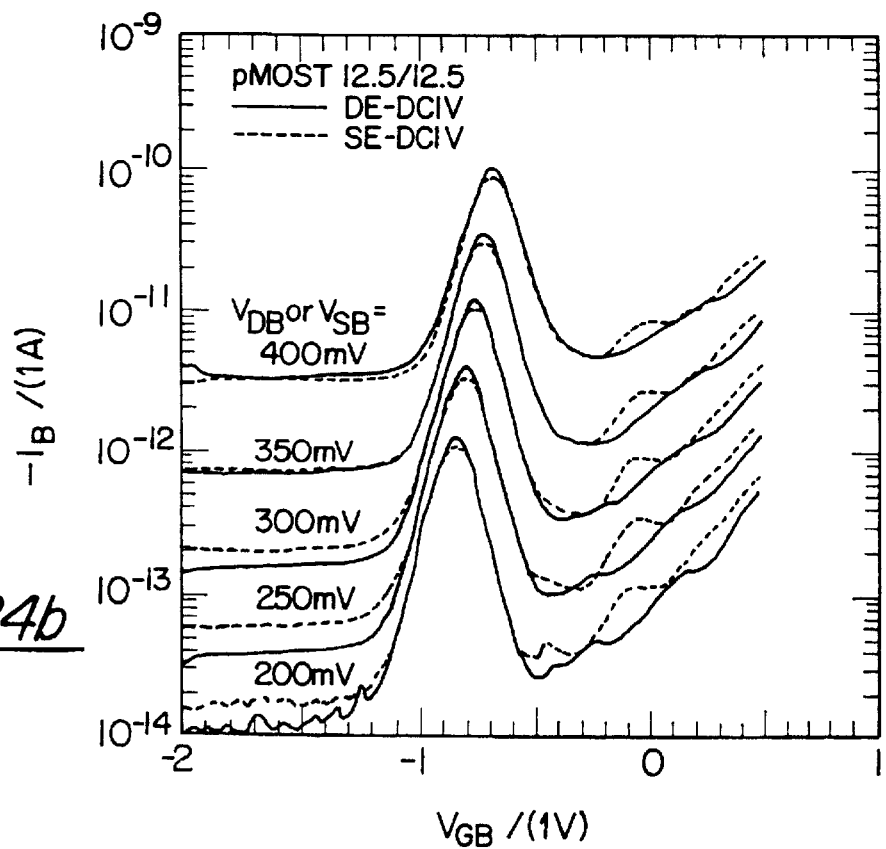
Figure 25A:
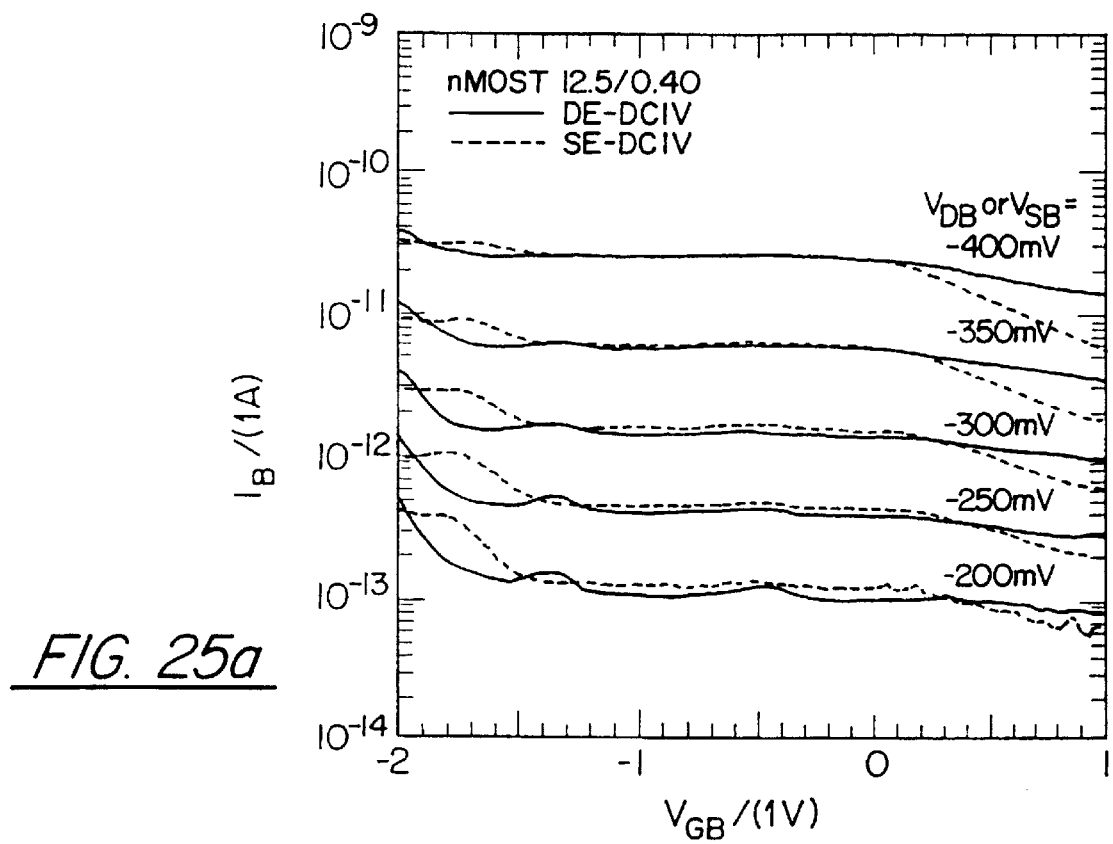
FIGS. 25(a and b) are curves depicting the DE-DCIV and SE-DCIV of a prestressed short-channel silicon nMOST and pMOST.
Figure 25B:
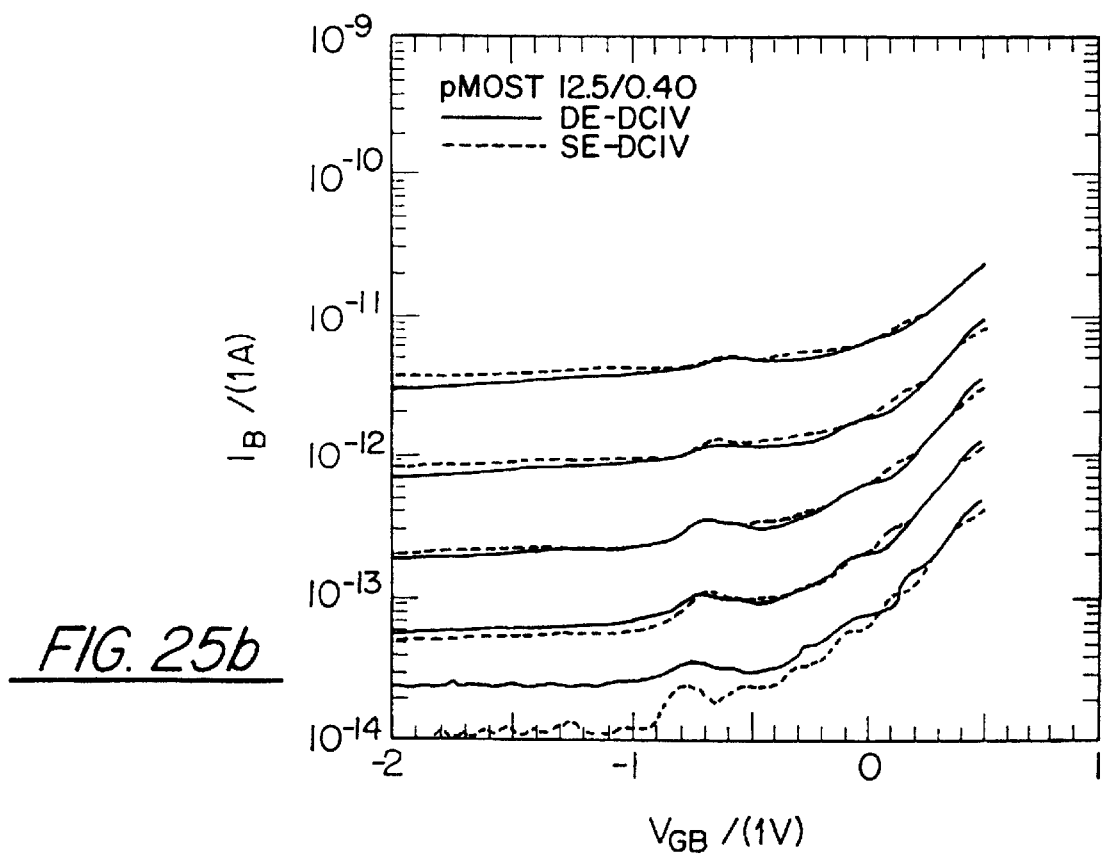
Figure 26A:
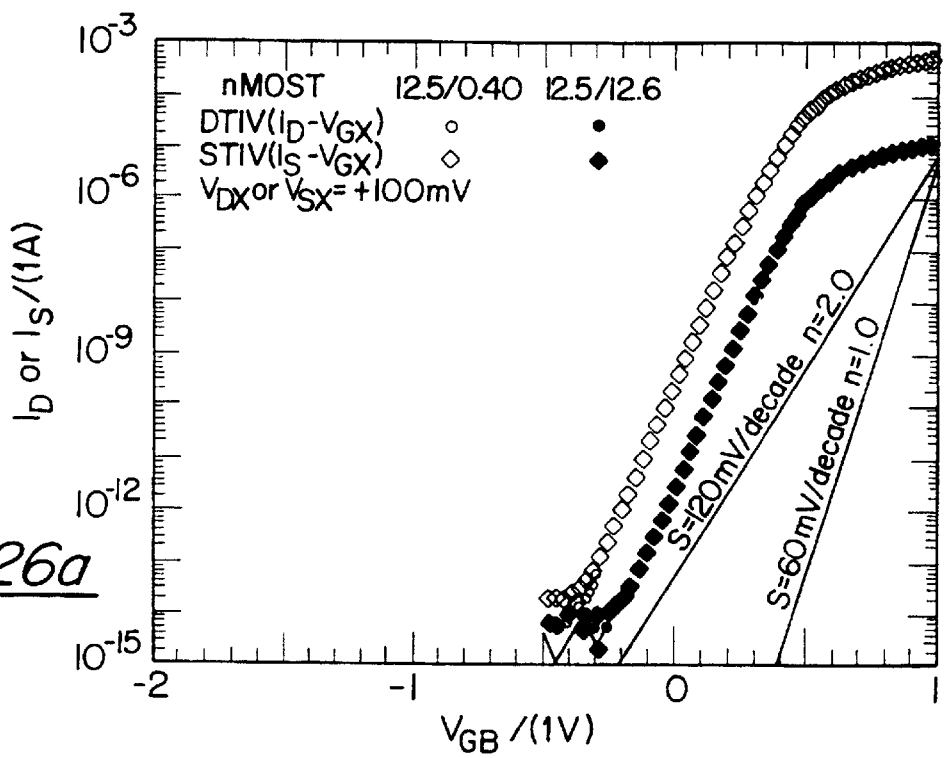
FIGS. 26(a and b) are curves depicting the drain and source transfer characteristics of a short and long channel nMOST and pMOST.
Figure 26B:
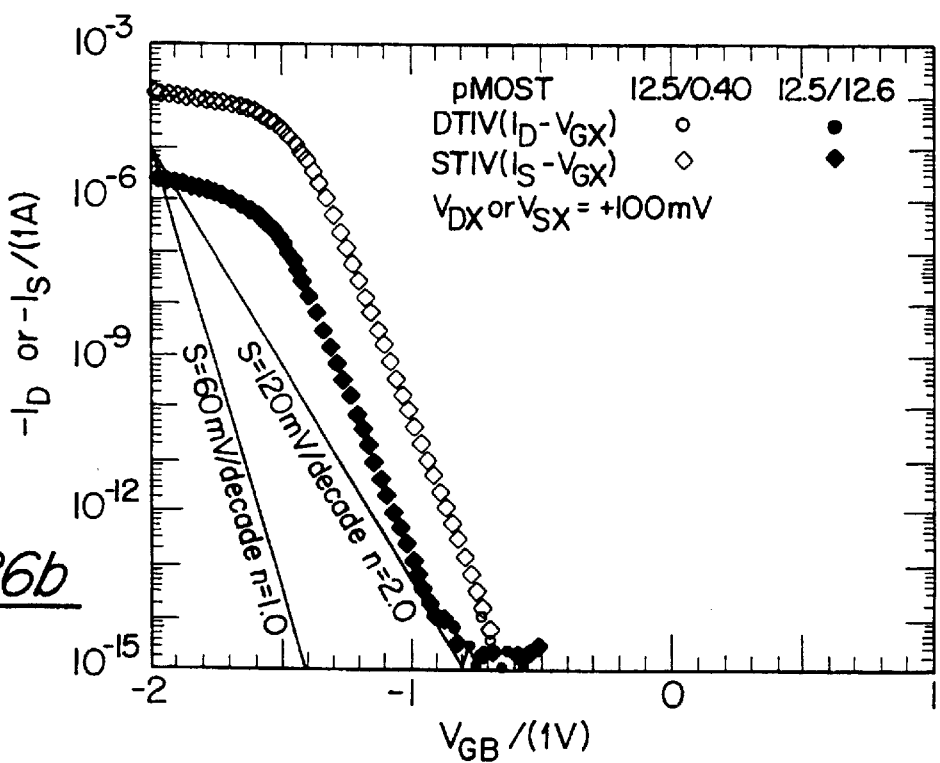
Figure 27A:
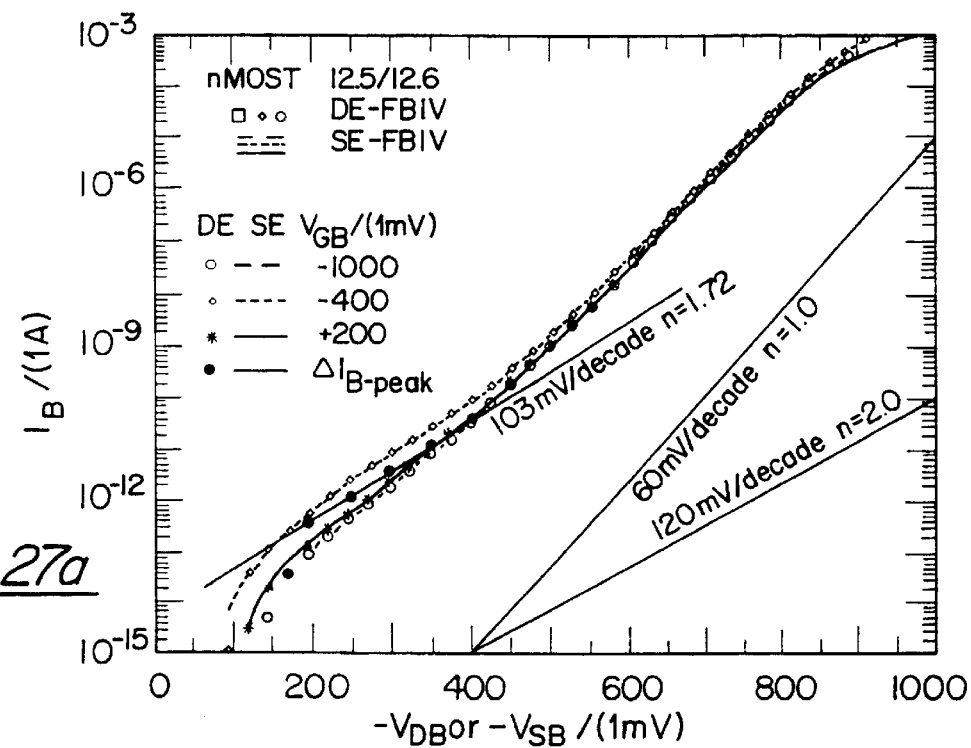
FIGS. 27(a and b) are curves depicting the drain and source junction diode current-voltage characteristics of a long- and short nMOST.
Figure 27B:
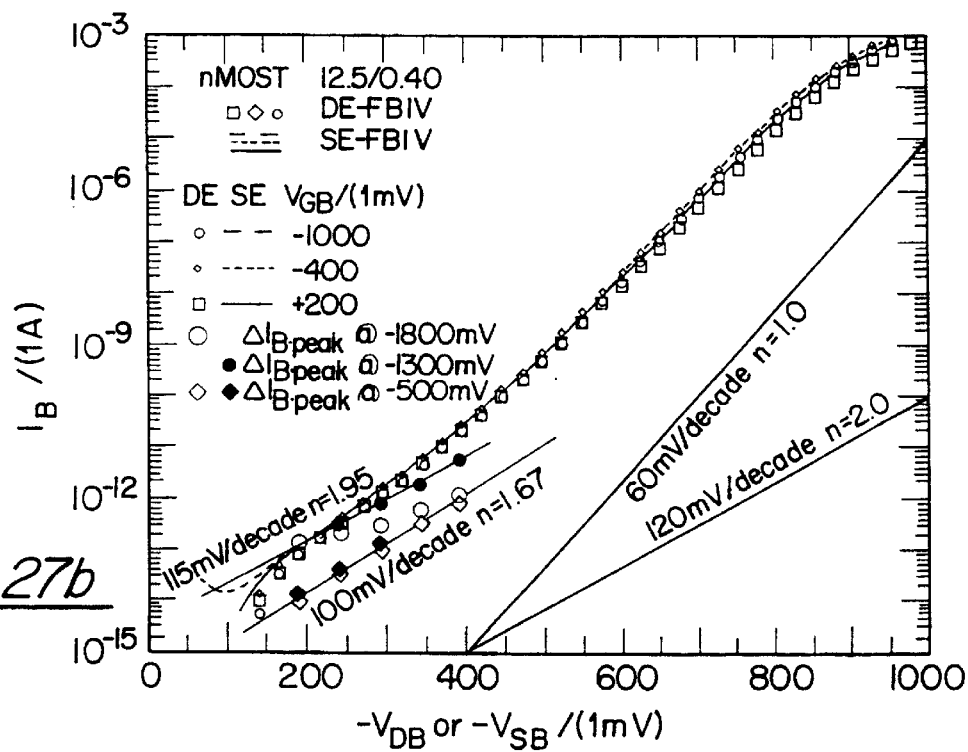
Figure 28A:
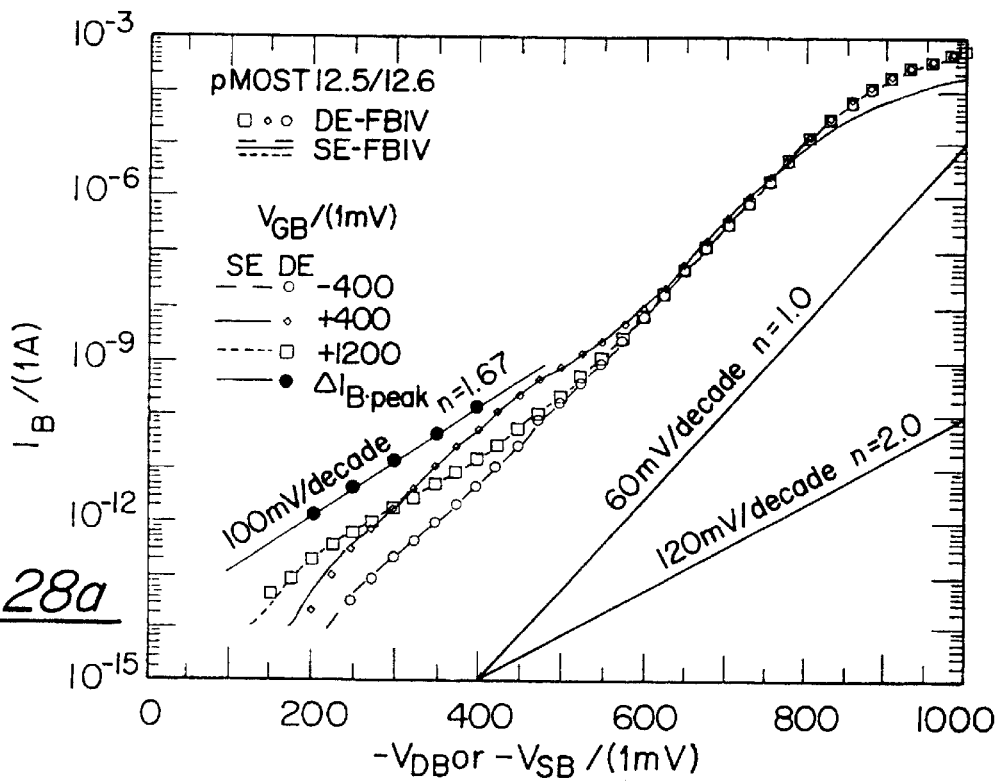
FIGS. 28(a and b) are curves depicting the drain and source junction diode current-voltage characteristics of a long- and short pMOSTs.
Figure 28B:
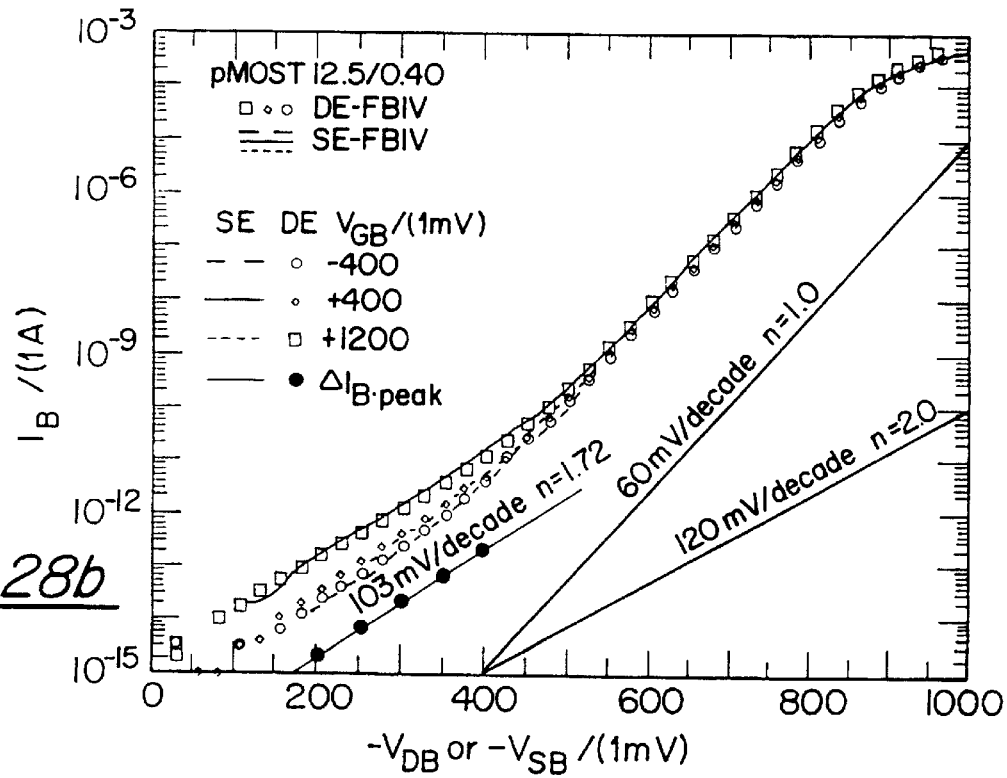
Figure 29A:
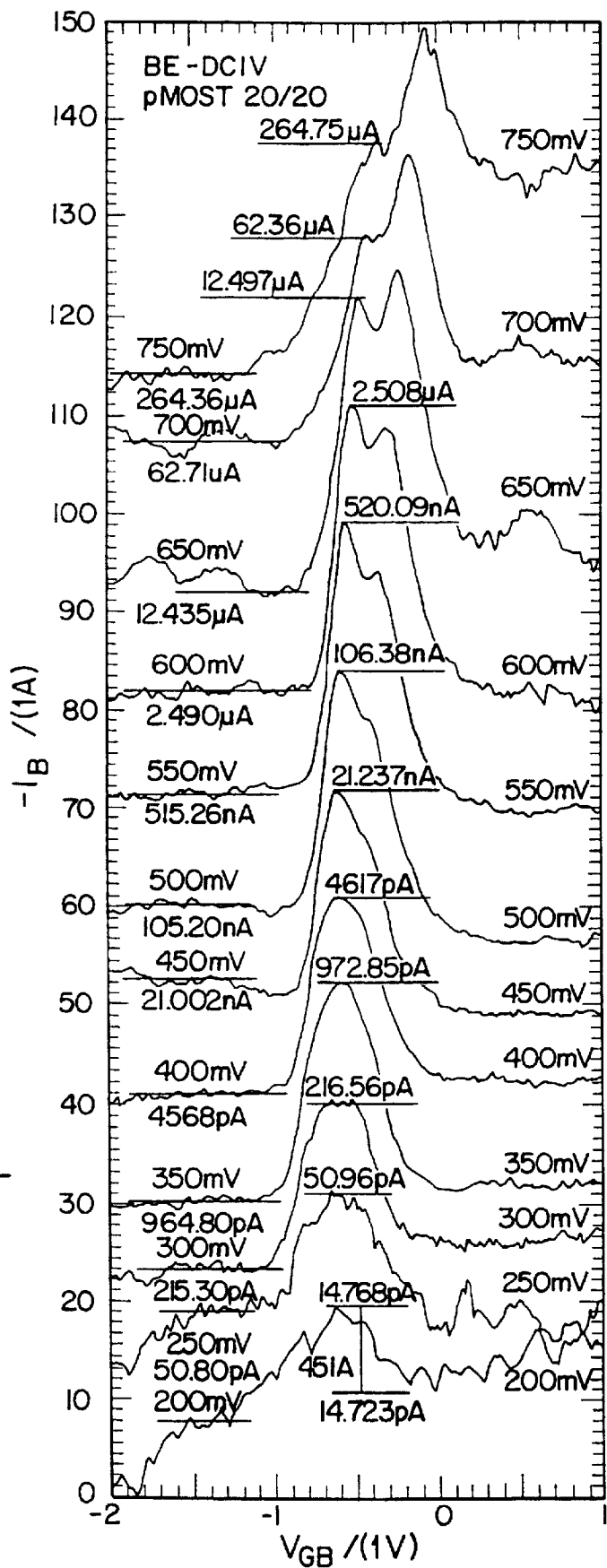
FIGS. 29(a and b) represent diagnostic bottom-emitter DCIV data of long-channel pMOSTs.
Figure 29B:
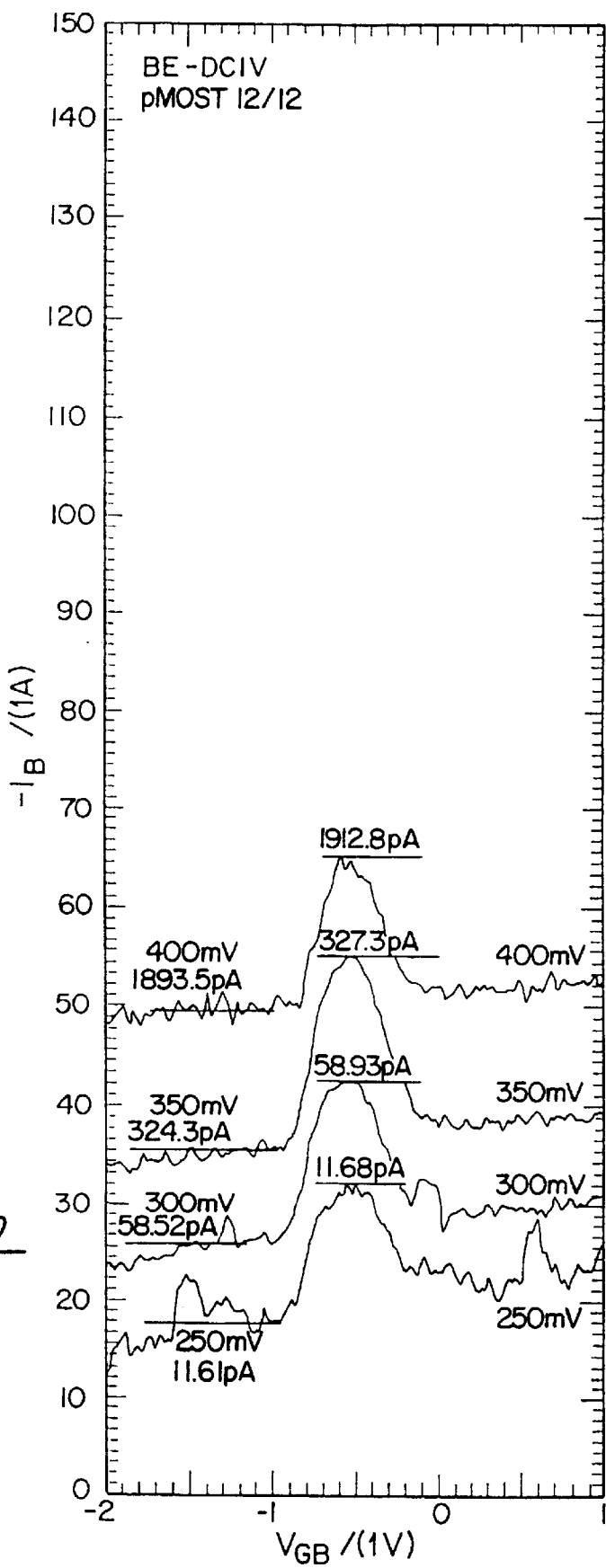
Figure 30:
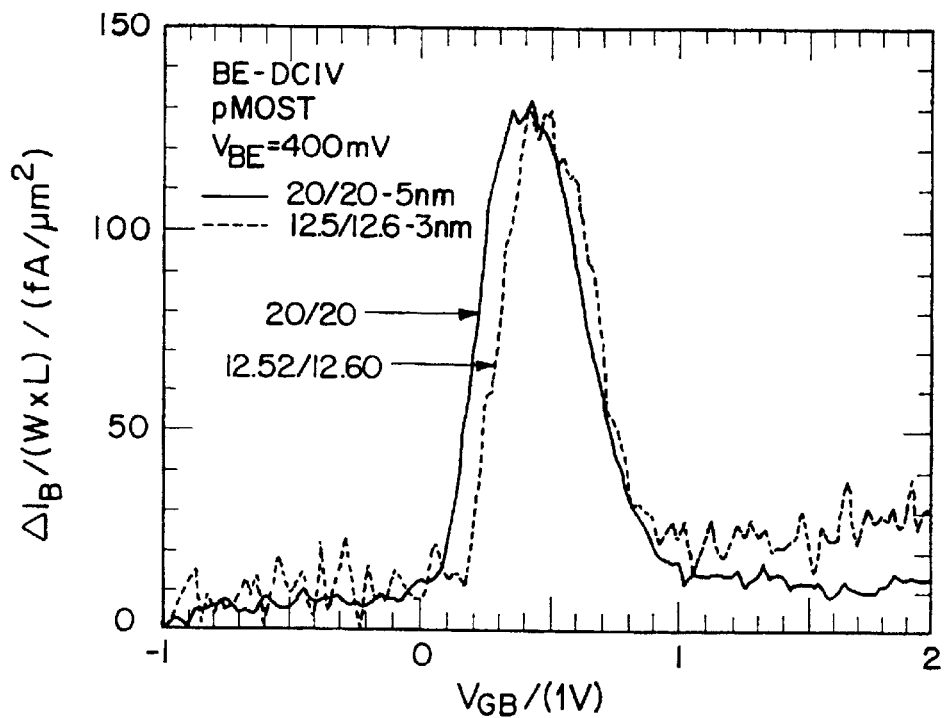
FIG. 30 is a curve depicting the scaling law demonstration of the BE-DCIV using long-channel pMOSTs from two technologies.
Figure 31:
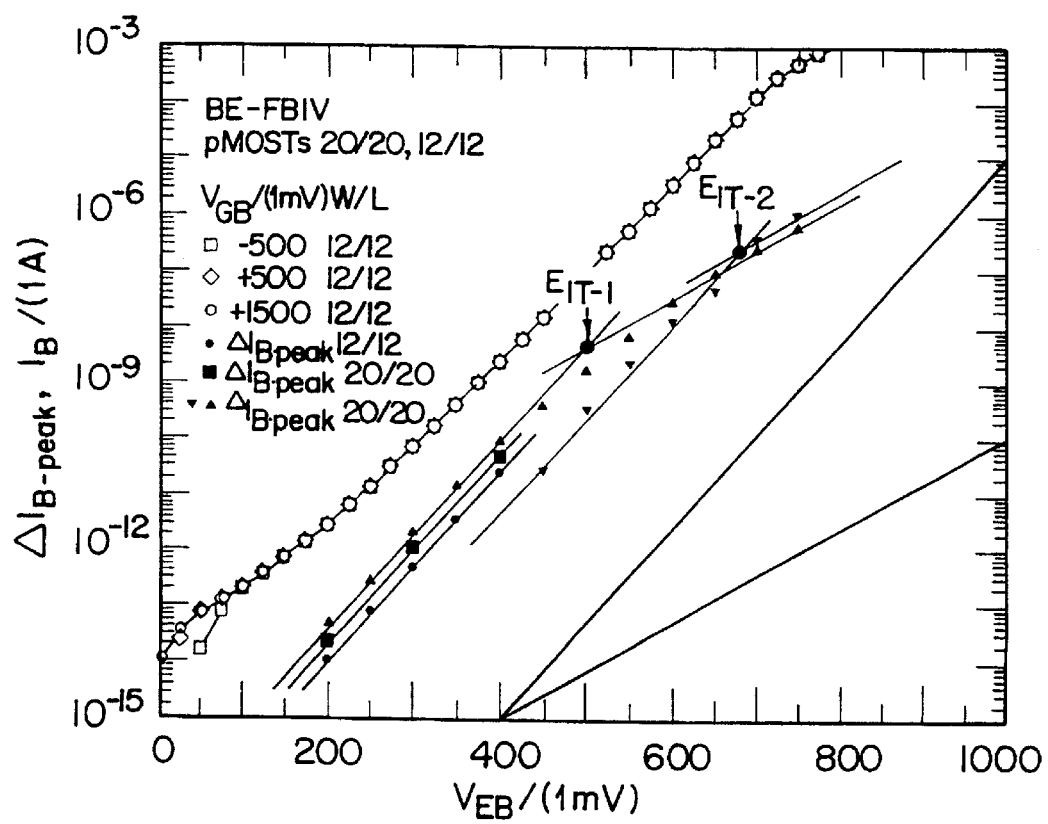
FIG. 31 is a BE-FBIV plot for long-channel pMOSTs from two technologies.

FIGS. 24(a) and (b) show the prestress drain-emitter $I_B$-$V_{GB}$ (SE-DCIV) in lines measured on the long-channel (12/12) nMOSTs and pMOSTs in the drain-emitter and source-emitter forward-bias voltage range (,$V_{DB}$, and ,$V_{SB}$,= $V_{PN}$) of 200 to 400 mV. FIGS. 25(a) and (b) show the corresponding data for the short-channel (12/0.4) nMOST and pMOST. The following conclusions can be deduced from these four figures. Each is given an industrial-application-specific subsection title based on elementary material-and-device physics.

331A Detection of Source-Drain-Engineering Design Symmetry

The nearly coincidence of the entire DE-DCIV and SE-DCIV curve at each forward bias level, for both the long and short nMOSTs and pMOSTs, indicates that the dopant impurity concentration profile of the drain and source junction are identical in this transistor device design. (The fine structure differences in these four figures reveal process-residual and macroscopic-microscopy inhomogeneities which will be described later on imperfection monitoring and process-technology transistor-design diagnosis.)

331B Scaling Law of the Baseline Current

The $I_B$ baselines ($I_{B-baseline}$) of the long nMOST are nearly identical to those of the short nMOST at each DE or SE forward bias voltage. This identity or non-scaling is observed also in the long and short pMOSTs. The indepen-dence of the $I_{B-baseline}$ on the channel length is expected since this current arises from recombination in the well and junctions space-charge regions (JSCR's) outside of the gate-oxide covered channel.

331C Monitoring Back Contact Quality of pn-Junctionless Well Structure

The $I_{B-baseline}$ at 200 mV forward drain or source bias is 10-times smaller in the pMOSTs (10 fA) than the nMOSTs (100 fA). The larger nMOST current arises from the recombination at the p-wafer/gold-metal back contact in the nMOST. This 'infinite' recombination velocity interface is shielded by the n-well/p-wafer junction in the pMOST~ Thus, if this S=∞ contact is shielded by a low/high p-wafer/p+implant 'back surface field' junction in the nMOST to prevent the minority carriers (electrons) from reaching the S=∞ p-wafer/gold-metal interface, the large nMOST base-line current could be significantly reduced. Thus, this $I_{B-baseline}$ serves as a monitor on fabrication technology and transistor design of (i) the back-contact, (ii) the p-well/p-wafer low/high junction, and (iii) the n-well/p-wafer n/p junction and its surface oxide passivation. Although the numerical example just described is at the femto-ampere range, the current level can be easily increased to the pico-ampere range by increasing the forward bias in order to facilitate factory applications, such as the 3 pA and 30 pA values measured at 400 mV forward bias illustrated in these four figure parts.

331D Scaling Law and Applications of Recombination at Interface Traps in the Channel The $I_{B-peak}$ (defined as $I_{B-peak}$ h $I_{B-peak}-I_{B-baseline}$) scales according to the channel length and provides further details on the drain-source junction impurity profiles. For the two channel lengths, the geometrical $I_{B-peak}$ ratio is 12.60/0.40= 31.5. At 400 mV forward bias (or any of the other four lower voltages), the $I_{B-peak}$ ratios are 37 pA/1.03 pA=35.9 (nMOSTs) and 106 pA/1.7 pA-62 (pMOST).

There are several conclusions on transistor design and fabrication technology which are revealed by leveraging this undesirable current, $I_{B-peak}$, from recombination of the minority carriers injected by the forward-biased p/n junction with the majority carriers of the well or wafer at the fabrication-residual interface traps under the gate oxide.

331D1 Location of the Interface Traps

The approximate scaling means that recombination must occur at the residual interface traps in the middle channel region (MCR) and not in the drain and source emitter junction space-charge-regions (DE-JSCR and SE-JSCR).

331D2 Process Controlled Lateral Interface Trap Distribution

The absence of the contribution to $I_B$ from the JSCR's can be because these traps in the DE-JSCR and SE-JSCR were inactivated by hydrogenation of the $Si_2$ and $SiO_2$ dangling bonds during the final-wafer-anneal in hydrogen to form the electrically inactive Si:H and SiO:H because the dangling bonds in the JSCR's are closer to the hydrogen sources in metal/drain and metal/source contact regions.

331D3 Quantum Density of States of Interface Traps

The absence of JSCR contributions can also be due to interface trap energy levels far from the midgap and the absence of midgap levels. Actually two peaks and broadened peaks were observed suggesting contributions from both the MCR and the JSCR locations and/or many energy levels from many species of interface traps. The one-energy-level Shockley-Read-Hall (SRH) recombination-rate theory, modified for recombination of injected minority carriers at interface traps, shows the $I_{B-MCR}$ α exp(qV/nkT) with n=1.00 when $V_{PN}$<~400 mV and n=2.00 when VPN>~400 mV and a rather small transition range of $V_{PN}$ ($V_{PN}$<~4kT/q or $I_B$~one decade) where 1<n<2. Thus, if there is a large $V_{PN}$ range (more than~two decades of $I_B$) over which n is a constant between 1 and 2 but not equal to 1 or 2, then there must be a lateral or y-dependent variation of the injected minority carrier concentration at the $SiO_2$/Si interface between the drain and source junction. This could not be distinguished from the contribution from the JSCRs, $I_{B-JSCR}$, whose n factor is between 1 and 2 over many decades of $I_B$ and n is not equal to 1.0 or 2.0, until $V_{PN}$ is sufficiently high ($V_{PN}$>~400 mV) that the contribution from the quasi-neutral regions (QNRs) of the base-well-substrate regions, $I_{B-QNR}$ (n=1.00), is ten times or more larger than $I_{B-JSCR}$.

331D4 True Channel Length and Lateral Source-Drain Diffusion Distance

The slightly larger experimental ratio $I_{B-PEAK}$ (L=12.6 μm)/$I_{B-PEAK}$ (L=0.40 μm)=35.9 compared with the drawn ratio, 31.5, suggests a better way to measure the diffusion of the drain and source impurity into the channel. The effective channel length is then given by (31.5/35.9)×(0.40)=0.877× 0.40=0.35 μm which is consistent with (or accidentally equal to) the 0.35-micron technology employed here to fabricate the transistors. This gives a lateral n+impurity diffusion of (0.40–0.35)/2=0.025 μm=250A which is insignificant in the L=12.6 μm. The p-channel length is (31.5/62)×(0.40)=0.203 μm and the boron lateral diffusion distance is (0.40–0.20)/ 2=0.050 μm=500 □.

331D5 Delineation of Process Variables

The much larger experimental pMOST $I_{B-PEAK}$ ratio (62) could arise from the following possible causes:

331D5A the cumulated p+boron $(Dt)^{1/2}$ along the $SiO_2$/Si interface was larger than that of the n+As or n+P from process temperature and time differences and from other fundamental and impurity-profile-difference reasons not accounted for in the process design models such as 331D5B the faster $SiO_2$/Si interfacial diffusion of the p+drain/p+source boron into the n-well than the arsenic or phosphorus of the n+drain/n+source, and 331D5C the As or P concentration on the n-well surface of the pMOST could be too low which would further increase the lateral diffusion distance of the boron into the n-well, or 331D5D the enhancement of the boron diffusivity by the higher piled-up As or P surface concentrations at the $SiO_2$/Si interface.

All of these possibilities could be included in the computer-aided process models. However the submicron channel length cannot be easily measured by conventional semiconductor distance measurement methods because of the very small surface distances. The above IB-PEAK method gives an unambiguous and easy solution.

331E Junction Tunneling at Gate-Covered p/n Junction Perimeter

The rapid exponential rise of $I_B$ with increasing accumulation ,$V_{GB}$, signifies recombination of the drain-source majority carriers (electrons in n+drain of nMOST with the accumulation-surface-channel majority carriers (holes in the p-well's surface accumulation layer) via elastic (or even inelastic—phonon-assisted) tunneling transition of the n+drain electrons into the p-well holes. This tunneling pathway has a very sharp onset or threshold, $V_{GB-tunnel-p/n} \equiv V_{GB-ptn}$, at the point when $E_{V-channel}$ at the $SiO_2$/Si interface is pulled up (nMOST) or down (PMOST) by the applied gate voltage to line up with $E_{C-drain}$. The magnitude of this threshold gate voltage is affected by the amount of the forward voltage applied to the p/n junction, as indicated by the discernible shift of $V_{GB-ptn}$ with $V_{DB}$ or $V_{SB}$ shown in the four figures. The threshold is very sharp indeed even at room temperatures because the thermal distribution of the carriers, ~2kT/q=50 mV, is rather small compared with $V_{GB-ptn}$ which is of the order of 1000 mV. The four figures also show that $V_{GB-ptn}$ is independent of the channel length and is $V_{GB}$=~+0.5V for the two pMOSTs and –1.5V for the two nMOSTs at ,$V_{DB}$, or ,$V_{SB}$,=200 mV. There are several monitoring and diagnostic applications of this p/n junction tunneling recombination current described below.

331E1 Tunneling Threshold Gate Voltage

The tunneling threshold gate voltage is determined by surface energy band bending $qY_{s-tunnel}$ required to cross drain conduction and channel valence band edges, $E_{C-drain}$ and $E_{V-channel}$, at the $SiO_2$/Si interface. This is given by $$Y_{S-tunnel} = .E_G/q. - V_{bi} \text{ (surface)}$$

$$= . E_G/q. - (kT/a)\log_{10}(N_{DD}P_{BB}/n_i^2)$$

which provides a design criteria on the standby current in the subthreshold or off range.

331E2 Sensitive Surface Impurity Concentration Monitor

The very strong exponential dependence of $I_{B-ptn}$ on barrier thickness or dopant impurity concentration provides an extremely sensitive way to monitor the surface concentration of the well impurity at the $SiO_2Si$ interface, such as that due to the retrograded well-impurity-profile designed to prevent drain-to-source punch-through at large (reverse-biased) drain-junction voltages. The nearly equal threshold of the 12.6 and 0.4 micron channels indicates that the lateral impurity profile is not altered significantly when the channel is shortened from 12.6 micron to 0.4 micron.

The observed difference between the pMOST (+0.5V) and the nMOST (−1.5V) is consistent with large drop of the boron surface concentration of the p-well in the nMOST and the pile-up of the phosphorus or arsenic surface concentration of the n-well in the pMOST. Thus, for the nMOST, the lower boron surface concentration in the p-well would give a thicker perimeter JSCR at the $Sio_2/Si$ interface and require a larger accumulation gate voltage to narrow the thickness of the perimeter JSCR sufficiently to start tunneling. In addition, the retrograde and pileup impurity surface concentrations at the poly-$Si/SiO_2$ and $SiO_2/Si$ interfaces would give an additional gate/well workfunction difference between the nMOST and pMOST which would also add toys-tunnel.

331E3 Monitoring Microscopic Inhomogeneities

The gate-voltage-dependent p/n junction perimeter tunneling current is such a strong exponential function of the local barrier thickness of the p/n junction that minute macroscopic-microscopic variations along the junction perimeter (z-direction) are amplified tremendously. The observed small source-drain differences of the $I_B$ in the accumulation-tunneling range shown in the four figures could be due to perimeter variations of 331E3A the impurity concentration at the $Sio_2/Si$ interface,
331E3B oxide and interface traps and charges and
331E3C oxide thickness between the source and the drain within one transistor and among transistors on the same and different sites/dies on each wafer, and inter-wafer variations.

Small long-short-channel differences of the $I_B$-$V_{GB}$ in the accumulation range are also evident in the four figures and on other sites of this wafer and on other wafers, suggesting the presence of unintentional microscopic and macroscopic technology-residual-random imperfections and nonuniformities across the wafer and between wafers.

331F The clearly visible $I_{B-peak}$ superimposed on the rising $I_{B-ptn}$ at about x0.5Vx beyond the $V_{GB-ptn}$ threshold, as displayed in the four figures, are listed below:

342A Minority Carrier Injection from Inversion Channel into Base Well

Figure 32A:
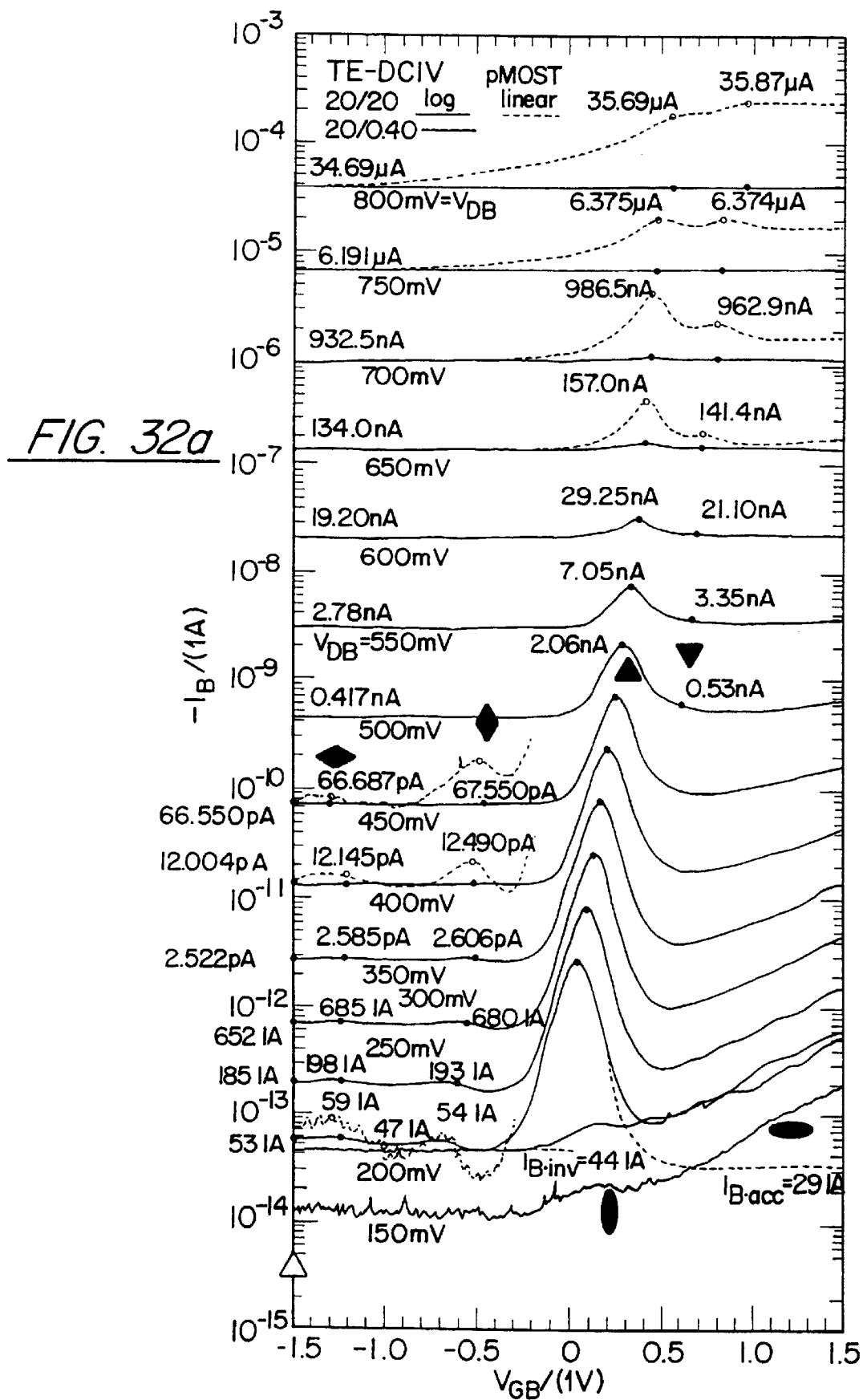
FIG. 32 is a graphical representation of top-emitter DCIV data.
Figure 32B:
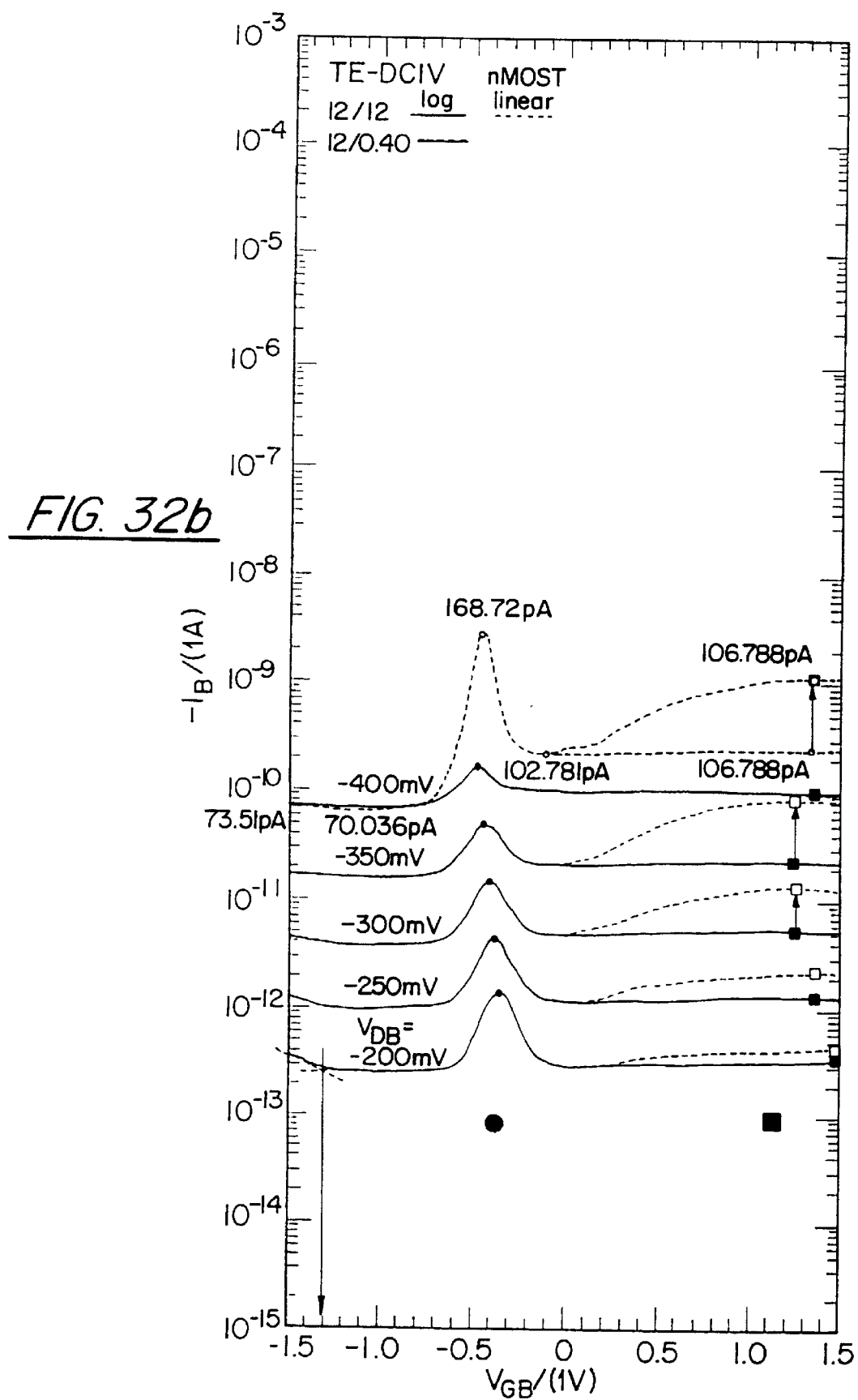
Figure 33B:
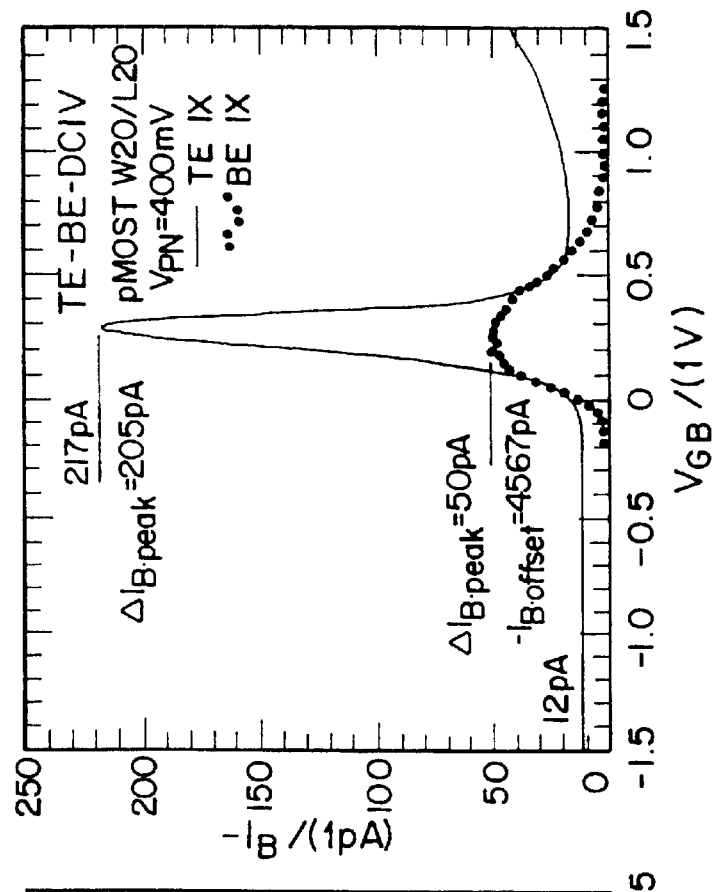
FIG. 33 is a graphical representation of the injection efficiency difference between the BE and TE DCIV configurations in a PMOST.
Figure 33A:
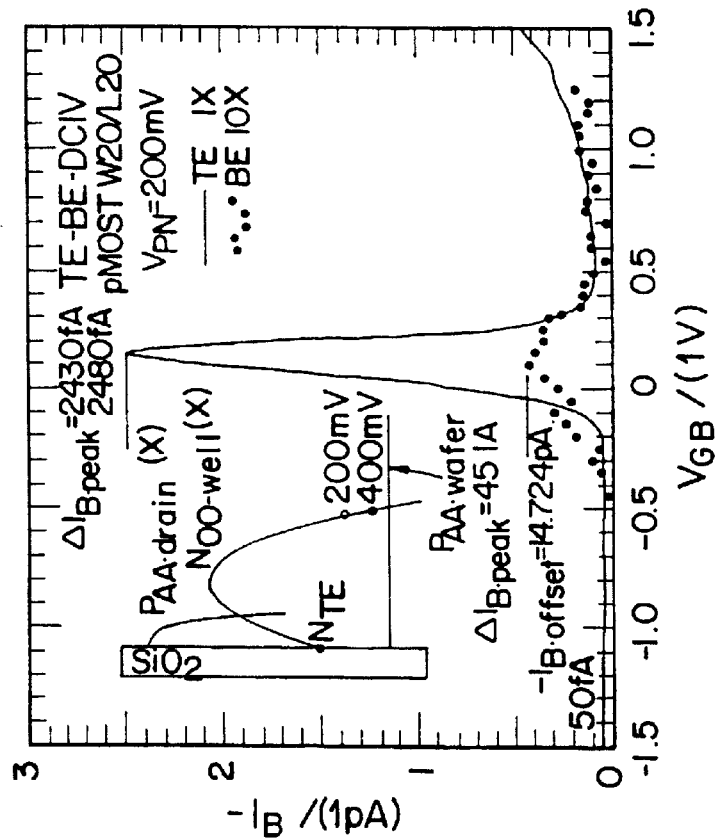
Figure 34:
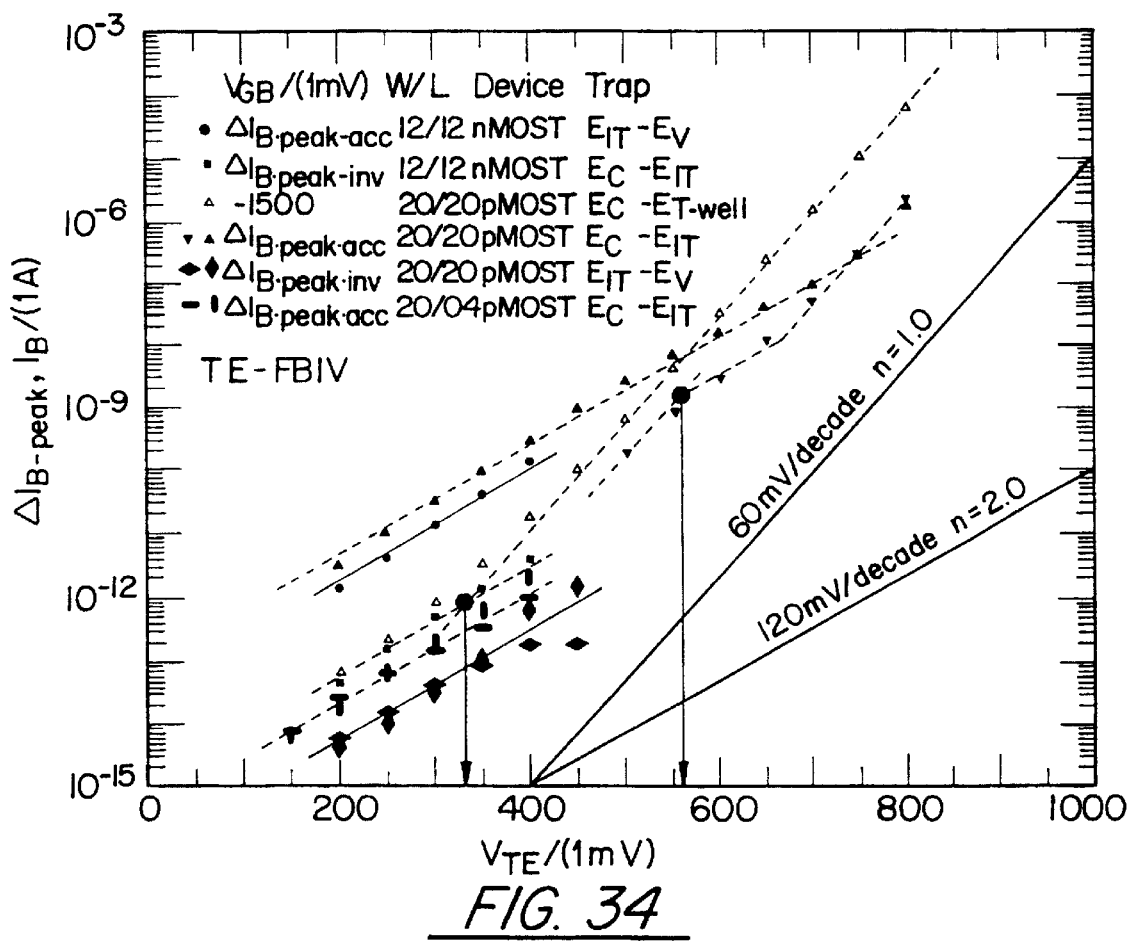
FIG. 34 is a TE-FBIV plot.
Figure 35:
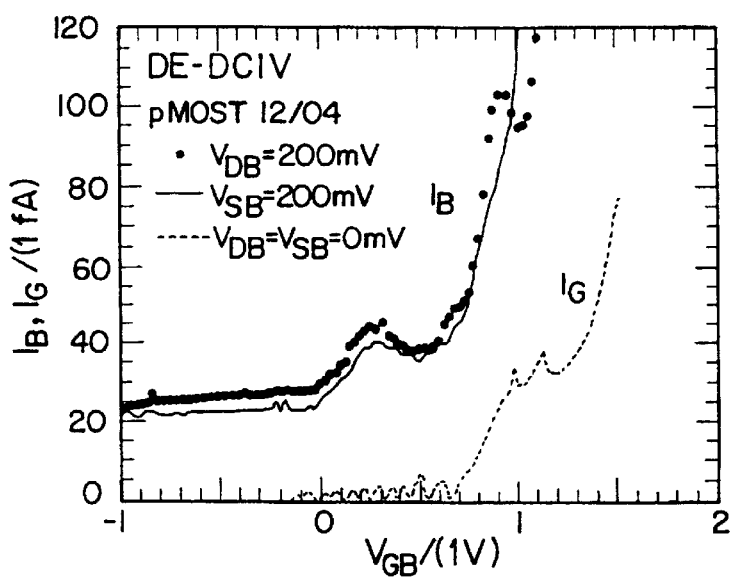
FIG. 35 is a graphical comparison of the gate tunneling and base recombination currents in a pMOST.

This is clearly indicated in FIG. 32(b) for the 12/12-3 nm nMOST by the distinct baseline current step on the two sides of the main peak at $V_{GB-peak}$=−0.4V. On the inversion side of the p-well ($V_{GB}$>$V_{GI}$=−0.3V where $U_S$=$U_F$), $I_{B-inv}$= 106.788 pA, while on the inversion side ($V_{GB}$<−1.0V where $U_S$=2$U_F$) $I_{B-inv}$=70.036 pA. This difference is a geometrical effect from the larger n-emitter area when the p-well surface is inverted to n-channel which is connected to the n+drain and n+source. The electron-emitter area is increased by 106.788 pA/70.036 pA −1.5248 which is almost exactly that predicted by the geometrical dimension of L=12.60 lm which gives 3L/2L=1.5 from the assumption that the drain and source junctions and the channel each has an area of L×W, thus, (As__$A_D$+$A_C$)/$A_S$+$A_D$)=3LW/2LW=1.5.

The minority carrier injection feature from the inverted channel is not evident in the TE-DCIV data of the 20/20 and 20/0.04 5 nm-pMOST in FIG. 32(a) which actually shows that $I_{B-inv}$<$I_{B-acc}$. The reason is that the difference is masked by the large p/n junction tunneling current in the accumulation range which increases $I_B$ much above its accumulation baseline value, $I_{B-acc}$. The causes of the higher p/n junction tunneling current with a lower tunnel-onset gate voltage in pMOST [$V_{GB-ptn}$~+0.5V in FIG. 32(a)] than that in the nMOST [$V_{GB-ptn}$~−1.5V in FIG. 32(b)] were discussed in subsection 331E and its subsections on the DE-DCIV and SE-DCIV bias configurations. The well-dopant-impurity profile or surface concentration at the $SiO_2/Si$ interface was the cause: retrograded boron surface concentration in the p-well of the nMOST is lower than the graded phosphorous or arsenic surface concentration in the n-well of the pMOST making the perimeter JSCR under the gate thicker in nMOST and its p/n junction tunneling onset gate voltage higher (−1.5V). In FIG. 32(a) is shown the 1.5×geometrical extrapolation of the $I_{B-acc}$ at the 200 mV forward bias voltage as a broken line, $I_{B-acc}$=29 fA.

What is claimed is:

1. A method for predicting the operation-time-to-failure of a metal-oxide-semiconductor transistor (MOST) having a gate terminal, a drain terminal, a source terminal, and a body or substrate terminal, comprising the steps of:
   (a) forward biasing a first one of said p/n junctions between said base terminal and a first one of said at least two other terminals;
   (b) applying an operating voltage to a second one of said at least two other p/n junctions at a level not substantially higher than a predetermined operating voltage which can be safely applied to said MOST during normal operation;
   (c) applying a gate voltage to said gate terminal;
   (d) measuring a DC base current in said MOST, said MOST experiencing a current accelerated stress responsive to said preceding steps in which said DC base current increases with the interface trap concentration in said MOST; and,
   (e) predicting said operation-time-to-failure based on said measured DC base current.

2. The method of claim 1, further comprising the steps of:
   (f) varying said gate voltage; and,
   (g) modeling spatial locations of said interface traps according to differences in said base current at different junction voltages.

3. The method of claim 1, wherein said MOST is embodied on a wafer.

4. The method of claim 1, wherein said MOST is embodied as a package.

5. The method of claim 1, wherein said MOST is embodied in a wafer and comprises source, drain, gate, and a well with or without a p/n junction on the wafer or substrate.

6. The method of claim 1, wherein said MOST comprises a complementary MOST (CMOST) embodied in an n-well on a p-type wafer.

7. The method of claim 1, wherein said MOST comprises a complementary MOST (CMOST) embodied as a p-well in an n-type wafer.

8. The method of claim 1, wherein said measuring step is undertaken for a period of time not more than approximately 450 hours, said predicting step thereafter representing a ten year test.

9. The method of claim 8, wherein said period of time is not more than approximately 100 hours.

10. The method of claim 1, wherein said measuring step is undertaken for a period of time not more than approximately 18 days, said predicting step thereafter representing a ten year test.

11. The method of claim 10, wherein said period of time is not more than approximately four days.

12. A method for predicting the operation-time-to-failure of a metal-oxide-semiconductor transistor (MOST) having a gate electrode, and plurality of p/n junctions which can be selectively operated as a lateral bipolar-junction transistor (LBJT) and as a vertical bipolar-junction transistor (VBJT), said MOST having a well p/n junction and an $SiO_2$/Si interface under a metal-electrode-covered gate oxide, the method comprising the steps of:

(a) forward biasing one of said p/n junctions to serve as an emitter/base junction of a selected one of said LBJT and said VBJT to inject minority carriers into said base body well and said interface under said gate-oxide;

(b) applying an operating voltage across a another one of said p/n junctions at a level not substantially higher than a predetermined operating voltage which can be safely applied to said MOST during normal operation;

(c) applying a gate voltage to said gate terminal;

(d) measuring a DC base current in said MOST, said MOST experiencing a current accelerated stress responsive to said minority carriers in which said DC base current increases with the interface trap concentration in said MOST; and, (e) predicting said operation-time-to-failure based on said measured DC base current.

13. The method of claim 12, further comprising the steps of:

(f) varying at least one of drain and source p/n junction voltages of said MOST; and, (g) modeling spatial locations of said interface traps according to differences in said base current at different p/n junction voltages.

14. The method of claim 12, wherein said measuring step is undertaken for a period of time not more than approximately 450 hours, said predicting step thereafter representing a ten year test.

15. The method of claim 14, wherein said period of time is not more than approximately 100 hours.

16. The method of claim 12, wherein said measuring step is undertaken for a period of time not more than approximately 18 days, said predicting step thereafter representing a ten year test.

17. The method of claim 16, wherein said period of time is not more than approximately four days.

18. A method for monitoring and diagnosing transistor design and fabrication technology for a metal-oxide-semiconductor transistor (MOST) having a gate electrode, two p/n junctions part of whose perimeter is overlapped by the gate electrode, a contact to the base, and with or without a p/n junction well, comprising the steps of:

(a) operating and diagnosing said MOST without hot carrier stress induced by forward or reverse biasing any of said p/n junctions;

(b) applying an operating voltage to one of said at least two other terminals at a level not too much higher than a predetermined safe operating voltage which can be applied to said MOST during normal operation;

(c) applying a varying gate voltage to said gate terminal; and, (d) measuring a parameter of said base current at a sensitivity on the order of at least femto-amperes.

19. The method of claim 18, further comprising the steps of:

(e) plotting said measured parameter of said base current against another operating characteristic of said MOST; and, (f) deriving at least one of a fabrication parameter and a design parameter of said MOST based on said plotting.

20. The method of claim 18, wherein said measured parameter of said base current is DC base current.

21. The method of claim 20, further comprising the steps of:

(e) measuring gate/base voltage as said other operating characteristic; and, (f) deriving a dopant impurity concentration profile of at least one of drain and source junctions of said MOST.

22. The method of claim 18, further comprising the steps of:

(e) measuring gate/base voltage as said other operating characteristic; and, (f) deriving a dopant impurity concentration profile of at least one of drain and source junctions of said MOST.

23. The method of claim 18, further comprising the steps of:

(e) measuring gate/base voltage as said other operating characteristic; and, (f) deriving an electrical channel length of said MOST.

24. The method of claim 18, wherein said measured parameter of said base current is base-line current.

25. The method of claim 18, wherein said measured parameter of said base current is peak base current minus base-line current.

26. The method of claim 18, comprising the step of measuring said DC base current at a sensitivity on the order of at least atto-amperes.

27. A method for predicting the operation-time-to-failure of a metal-oxide-semiconductor transistor (MOST) having a gate electrode, a plurality of p/n junctions which can be selectively operated as a lateral bipolar-junction transistor (LBJT) and as a vertical bipolar-junction transistor (VBJT), a well p/n junction, an $SiO_2$/Si interface under a metal-electrode-covered gate oxide, at least two of said plurality of p/n junctions being a source and drain p/n junctions, and a remote p/n junction adjacent to said source and drain p/n junctions, the method comprising the steps of:

(a) forward biasing said remote p/n junction to inject minority carriers into said base body well and said interface under said gate-oxide;

(b) applying an operating voltage across one of said plurality of p/n junctions at a level not substantially higher than a predetermined operating voltage which can be safely applied to said MOST during normal operation;

(c) applying a gate voltage to said gate terminal;

(d) measuring a DC base current in said MOST, said MOST experiencing a current accelerated stress responsive to said minority carriers in which said DC base current increases with the interface trap concentration in said MOST; and, (e) predicting said operation-time-to-failure based on said measured DC base current.

28. The method of claim 27, further comprising the steps of:

(f) varying at least one of drain and source p/n junction voltages of said MOST; and, (g) modeling spatial locations of said interface traps according to differences in said base current at different p/n junction voltages.

29. The method of claim 27, wherein said measuring step is undertaken for a period of time not more than approximately 450 hours, said predicting step thereafter representing a ten year test.

30. The method of claim 29, wherein said period of time is not more than approximately 100 hours.

31. The method of claim 27, wherein said measuring step is undertaken for a period of time not more than approximately 18 days, said predicting step thereafter representing a ten year test.

32. The method of claim 31, wherein said period of time is not more than approximately four days.

33. A method for monitoring and diagnosing transistor design and fabrication technology for a metal-oxide-semiconductor transistor (MOST) having a gate electrode, two p/n junctions part of whose perimeter is overlapped by the gate electrode, a contact to the base, a very thin gate oxide film enhancing a gate tunneling current, and with or without a p/n junction well, comprising the steps of:

(a) operating and diagnosing said MOST without hot carrier stress induced by forward or reverse biasing any of said p/n junctions;

(b) applying an operating voltage to one of said at least two other terminals at a level not too much higher than a predetermined safe operating voltage which can be applied to said MOST during normal operation;

(c) applying a varying gate voltage to said gate terminal; and, (d) measuring a parameter of said gate tunneling current.

34. The method of claim 33, further comprising the steps of:

(e) plotting said measured parameter of said gate tunneling current against another operating characteristic of said MOST; and, (f) deriving at least one of a fabrication parameter and a design parameter of said MOST based on said plotting.

35. The method of claim 34, wherein oxide thickness uniformity is derived.

36. The method of claim 34, wherein a channel impurity concentration level is derived.

37. The method of claim 34, wherein a source impurity concentration level is derived.

38. The method of claim 34, wherein a drain impurity concentration level is derived.

39. The method of claim 34, wherein an interface trap density is derived.

40. The method of claim 34, wherein an oxide trap density is derived.

41. The method of claim 33, comprising the step of measuring said parameter of said gate tunneling current at a sensitivity on the order of at least atto-amperes.

42. The method of claim 33, comprising the step of measuring said parameter of said gate tunneling current at a sensitivity on the order of at least atto-amperes.

43. The method of claim 34, comprising the step of measuring at least one of said parameter of said gate tunneling current and said another operating characteristic at a sensitivity on the order of at least femto-amperes.

44. The method of claim 34, comprising the step of measuring at least one of said parameter of said gate tunneling current and said another operating characteristic at a sensitivity on the order of at least atto-amperes.

\* \* \* \* \*

UNITED STATES PATENT AND TRADEMARK OFFICE
CERTIFICATE OF CORRECTION

PATENT NO. : 6,275,059 B1
DATED : August 14, 2001
INVENTOR(S) : Sah et al.

Page 1 of 1

It is certified that error appears in the above-identified patent and that said Letters Patent is hereby corrected as shown below:

<u>Column 1,</u>
Line 4, insert: -- STATEMENT REGARDING FEDERALLY SPONSORED RESEARCH OR DEVELOPMENT
This invention was made with government support under contract ECS-9220382, awarded by the National Science Foundation to the University of Florida, and the United States Government has certain rights in this invention. --

Signed and Sealed this

Ninth Day of April, 2002

Attest:

*Attesting Officer*

JAMES E. ROGAN
*Director of the United States Patent and Trademark Office*